US006041431A

United States Patent [19]

Goldstein

[11] Patent Number: 6,041,431

[45] Date of Patent: Mar. 21, 2000

[54] METHOD AND APPARATUS FOR PERFORMING ERROR CORRECTION CODE OPERATIONS

[75] Inventor: Arthur M. Goldstein, Santa Cruz, Calif.

[73] Assignee: Adapter, Inc., Milpitas, Calif.

[21] Appl. No.: 08/933,568

[22] Filed: Sep. 19, 1997

[51] Int. Cl.[7] .................................................... H03M 13/00

[52] U.S. Cl. ........................... 714/784; 714/756; 714/785

[58] Field of Search .............................. 371/37.11, 37.12, 371/37.4, 37.5, 37.1; 714/784, 785, 755, 756, 752

[56] References Cited

U.S. PATENT DOCUMENTS

| | | | |
|---|---|---|---|
| 5,719,884 | 2/1998 | Roth et al. ........................... | 371/37.14 |
| 5,805,617 | 9/1998 | Im ....................................... | 371/37.12 |

OTHER PUBLICATIONS

S. Lin and D. Costello, Jr., "*Error Control Coding*", Published 10–82, © 1983, Prentice–Hall, Inc. Englewood Cliffs, NJ, pp. 167–174.

Unknown, "Chapter 1, Introduction".

S. Wilson, "*Digital Modulation and Coding*", 1996, Ch. 5, pp. 470–472, Prentice Hall, NJ.

N. Glover and T. Dudley, "*Practical Error Correction Design for Engineers*", 1991, Cirrus Logic, Inc., CO, Rev. 2nd Ed.

W. W. Peterson and E.J. Weldon, Jr., "*Error–Correcting Codes*", 1972, (12th printing 1994), Mass. Inst. of Technology, pp. 131–136.

*Primary Examiner*—Albert De Cady
*Assistant Examiner*—Jason Greene
*Attorney, Agent, or Firm*—Martine Penilla & Kim, LLP

[57] ABSTRACT

A method for processing encoded data using error control coding in accordance with the present invention includes: a) obtaining Q codewords and P codewords from a storage location, wherein the Q codewords and the P codewords are all obtained in a single pass through the storage location, b) calculating P partial syndromes for said P codewords, c) calculating Q partial syndromes for the Q codewords, and d) storing the Q partial syndromes and the P partial syndromes in a buffer that is separate from the main memory. In some embodiments, storing the Q partial syndromes and the P partial syndromes in the buffer includes storing the Q partial syndromes in a first buffer, and storing the P partial syndromes in a second buffer.

27 Claims, 15 Drawing Sheets

210 212

| Memory Address | Byte Offset | |
|---|---|---|
| 0 | 0 | 1 |
| 1 | 2 | 3 |
| 2 | 4 | 5 |
| 3 | 6 | 7 |
| 4 | 8 | 9 |
| 5 | 10 | 11 |
| --------- | ----- | ----- |
| --------- | ----- | ----- |
| 1167 | 2334 | 2335 |
| 1168 | 2336 | 2337 |
| 1169 | 2338 | 2339 |
| | Even Bytes | Odd Bytes |

| Data | P-Parity | Q-Parity |
|---|---|---|
| 1038 Bytes | 86 Bytes | 52 Bytes |
| 0 1031 | 1032 1117 | 1118 1169 |

← Protected by ECC → ← ECC Bytes →

FIGURE 4
Prior Art 228 229a 229b 229c 229d 229e 229f 229g 229h 229i 229j 229k 229l 232 232

| | | 0 | 1 | 2 | 3 | | 25 | | 38 | 39 | 40 | 41 | 42 | Header + user data + part of auxiliary data |
|---|---|---|---|---|---|---|---|---|---|---|---|---|---|---|
| 230a | 0 | 0 | 1 | 2 | 3 | -- | 25 | -- | 38 | 39 | 40 | 41 | 42 | |
| 230b | 1 | 43 | 44 | 45 | 46 | -- | 68 | -- | 81 | 82 | 83 | 84 | 85 | |
| 230c | 2 | 86 | 87 | 88 | 89 | -- | 111 | -- | 124 | 125 | 126 | 127 | 128 | |
| 230d | -- | | | | | | | | | | | | | |
| 230e | -- | | | | | Q | | | | | | | | |
| 230f | -- | P | | | | | | | | | | | | |
| 230g | 22 | | | | | | | | | | | | | |
| 230h | 23 | | | | | | | | | | | | | |
| 230i | 24 | 1032 | 1033 | 1034 | | | | | 1070 | 1071 | 1072 | 1073 | 1074 | P-Parity |
| 230j | 25 | 1075 | 1076 | 1077 | | | | | 1113 | 1114 | 1115 | 1116 | 1117 | |
| 230k | 26 | 1118 | 1119 | 1120 | -- | -- | 1143 | | | | | | | Q-Parity |
| 230l | 27 | 1144 | 1145 | 1146 | -- | -- | 1169 | | | | | | | |

FIGURE 5
Prior Art

| $r_0$ | $r_1$ | $r_2$ | -- | -- | $r_{n-4}$ | $r_{n-3}$ | $r_{n-2}$ | $r_{n-1}$ |
|---|---|---|---|---|---|---|---|---|
| $\alpha^{n-1}$ | $\alpha^{n-2}$ | $\alpha^{n-3}$ | --- | --- | $\alpha^3$ | $\alpha^2$ | $\alpha^1$ | $\alpha^0$ |

| | | | | | | | 293 | 294 |
|---|---|---|---|---|---|---|---|---|---|
| 290 → | 42 | 85 | 128 | | | 988 | 1031 | 1074 | 1117 |
| 292 → | $r_0$ | $r_1$ | $r_2$ | -- | -- | $r_{22}$ | $r_{23}$ | $r_{24}$ | $r_{25}$ |
| 296 → | $\alpha^{25}$ | $\alpha^{24}$ | $\alpha^{23}$ | --- | --- | $\alpha^3$ | $\alpha^2$ | $\alpha^1$ | $\alpha^0$ |

320

| | |
|---|---|
| P | Q codeword taken as a whole |
| Q | P codeword taken as a whole |
| $P^i$ | Particular P codeword $(0 \leq i \leq 42)$ |
| $Q^j$ | Particular Q codeword $(0 \leq j \leq 25)$ |
| $P_k$ | $K^{th}$ element within P $(0 \leq k \leq 25)$ |
| $Q_l$ | $l^{th}$ element within P $(0 \leq l \leq 42)$ |
| $PQ_m$ | $m^{th}$ element within Q that intersects with a specific element within P |
| $QP_n$ | $n^{th}$ element within P that intersects with a specific element within Q |
| $S_0(P^i)$ | Partial $S_0$ for $P^i$ |
| $S_1(P^i)$ | Partial $S_1$ for $P^i$ |
| $S_0(Q^j)$ | Partial $S_0$ for $Q^j$ |
| $S_1(Q^j)$ | Partial $S_1$ for $Q^j$ |
| P_ADR | Address pointer of P_BUF |
| Q_ADR | Address pointer of Q_BUF |
| P_BUF | Buffer for $P^i$ symdromes |
| Q_BUF | Buffer for $Q^j$ symdromes |
| SEC | Single Error Correction |
| + | Interger Addition |
| - | Interger Subtraction |
| * | Interger Multiplication |
| $\oplus$ | Galois Field Addition |
| $\otimes$ | Galois Field Multiplication |
| Modulo | Remainder after performing interger division by modulus |

| | 0 | 1 | 2 | 3 | 4 | 5 | 6 | 7 | -- | 25 | 26 | 27 | -- | 37 | 38 | 39 | 40 | 41 | 42 |
|---|---|---|---|---|---|---|---|---|---|---|---|---|---|---|---|---|---|---|---|
| 0 | 0 | 1 | 2 | 3 | 4 | 5 | 6 | 7 | -- | 25 | 26 | 27 | -- | 37 | 38 | 39 | 40 | 41 | 42 |
| 1 | 0 | 1 | 2 | 3 | 4 | 5 | 6 | 7 | -- | 25 | 26 | 27 | -- | 37 | 38 | 39 | 40 | 41 | 42 |
| 2 | 0 | 1 | 2 | 3 | 4 | 5 | 6 | 7 | -- | 25 | 26 | 27 | -- | 37 | 38 | 39 | 40 | 41 | 42 |
| 3 | 0 | 1 | 2 | 3 | 4 | 5 | 6 | 7 | -- | 25 | 26 | 27 | -- | 37 | 38 | 39 | 40 | 41 | 42 |
| -- | -- | -- | -- | -- | -- | -- | -- | -- | -- | -- | -- | -- | -- | -- | -- | -- | -- | -- | -- |
| 21 | 0 | 1 | 2 | 3 | 4 | 5 | 6 | 7 | -- | 25 | 26 | 27 | -- | 37 | 38 | 39 | 40 | 41 | 42 |
| 22 | 0 | 1 | 2 | 3 | 4 | 5 | 6 | 7 | -- | 25 | 26 | 27 | -- | 37 | 38 | 39 | 40 | 41 | 42 |
| 23 | 0 | 1 | 2 | 3 | 4 | 5 | 6 | 7 | -- | 25 | 26 | 27 | -- | 37 | 38 | 39 | 40 | 41 | 42 |
| 24 | 0 | 1 | 2 | 3 | 4 | 5 | 6 | 7 | -- | 25 | 26 | 27 | -- | 37 | 38 | 39 | 40 | 41 | 42 |
| 25 | 0 | 1 | 2 | 3 | 4 | 5 | 6 | 7 | -- | 25 | 26 | 27 | -- | 37 | 38 | 39 | 40 | 41 | 42 |

| | 0 | 1 | 2 | 3 | 4 | 5 | 6 | 7 | -- | 25 | 26 | 27 | -- | 37 | 38 | 39 | 40 | 41 | 42 |
|---|---|---|---|---|---|---|---|---|---|---|---|---|---|---|---|---|---|---|---|
| 0 | 0 | 25 | 24 | 23 | 22 | 21 | 20 | 19 | -- | 1 | 0 | 25 | -- | 15 | 14 | 13 | 12 | 11 | 10 |
| 1 | 1 | 0 | 25 | 24 | 23 | 22 | 21 | 20 | -- | 2 | 1 | 0 | -- | 16 | 15 | 14 | 13 | 12 | 11 |
| 2 | 2 | 1 | 0 | 25 | 24 | 23 | 22 | 21 | -- | 3 | | 1 | -- | 17 | 16 | 15 | 14 | 13 | 12 |
| 3 | 3 | 0 | 1 | 0 | 25 | 24 | 23 | 22 | -- | 4 | | 2 | -- | 18 | 17 | 16 | 15 | 14 | 13 |
| -- | -- | -- | -- | -- | -- | -- | -- | -- | -- | -- | -- | -- | -- | -- | -- | -- | -- | -- | -- |
| 21 | 21 | 20 | 19 | 18 | 17 | 16 | 15 | 14 | -- | 22 | 21 | 20 | -- | 10 | 9 | 8 | 7 | 6 | 5 |
| 22 | 22 | 21 | 20 | 19 | 18 | 17 | 16 | 15 | -- | 23 | 22 | 21 | -- | 11 | 10 | 9 | 8 | 7 | 6 |
| 23 | 23 | 22 | 21 | 20 | 19 | 18 | 17 | 16 | -- | 24 | 23 | 22 | -- | 12 | 11 | 10 | 9 | 8 | 7 |
| 24 | 24 | 23 | 22 | 21 | 20 | 19 | 18 | 17 | -- | 25 | 24 | 23 | -- | 13 | 12 | 11 | 10 | 9 | 8 |
| 25 | 25 | 24 | 23 | 22 | 21 | 20 | 19 | 18 | -- | 0 | 25 | 24 | -- | 14 | 13 | 12 | 11 | 10 | 9 |
| 26 | 0 | 1 | 2 | 3 | 4 | 5 | 6 | 7 | -- | 25 | | | | | | | | | |
| 27 | 0 | 1 | 2 | 3 | 4 | 5 | 6 | 7 | -- | 25 | | | | | | | | | |

| | P_ADR | Contents |
|---|---|---|
| 538a | 0 | $S_0$ and $S_1$ for P0 |
| 538b | 1 | $S_0$ and $S_1$ for P1 |
| 538c | 2 | $S_0$ and $S_1$ for P2 |
| | --- | $S_0$ and $S_1$ for $P^i$ |
| 538d | 40 | $S_0$ and $S_1$ for P40 |
| 538e | 41 | $S_0$ and $S_1$ for P41 |
| 538f | 42 | $S_0$ and $S_1$ for P42 |

FIGURE 18

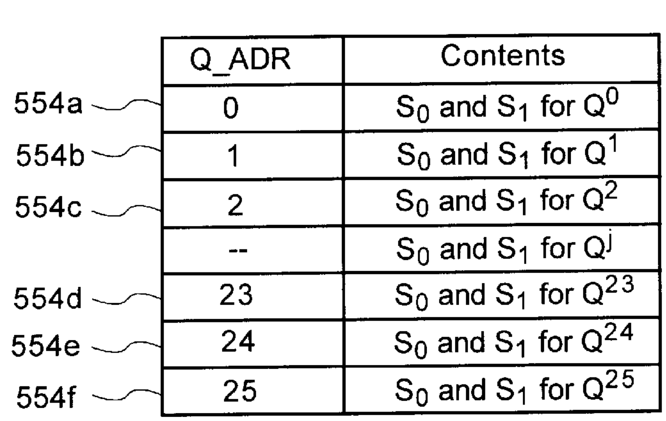
| Q_ADR | Contents |
|---|---|
| 0 | $S_0$ and $S_1$ for $Q^0$ |
| 1 | $S_0$ and $S_1$ for $Q^1$ |
| 2 | $S_0$ and $S_1$ for $Q^2$ |
| -- | $S_0$ and $S_1$ for $Q^j$ |
| 23 | $S_0$ and $S_1$ for $Q^{23}$ |
| 24 | $S_0$ and $S_1$ for $Q^{24}$ |
| 25 | $S_0$ and $S_1$ for $Q^{25}$ |
FIGURE 22
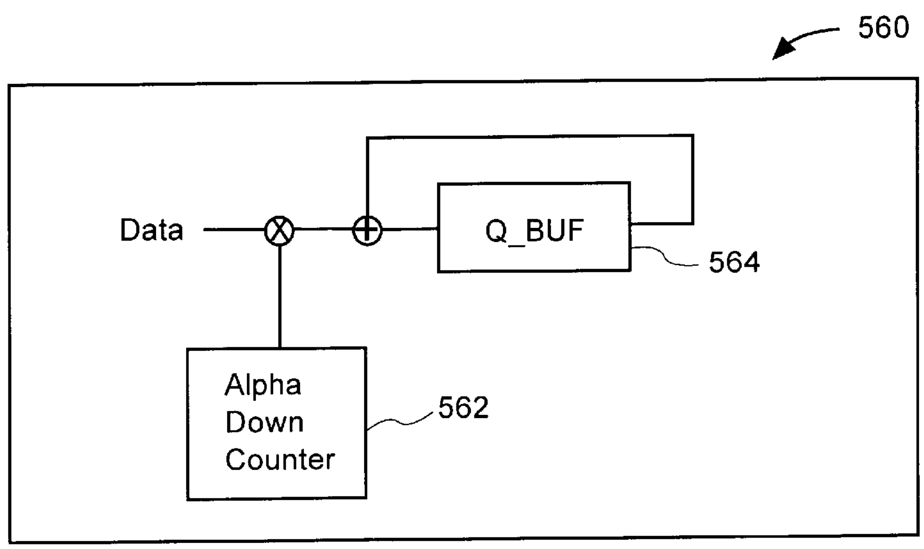
FIGURE 23
| $S_0$ | $S_1$ | Action |
|---|---|---|
| zero | zero | No action necessary; continue |
| nonzero | zero | SEC not possible |
| zero | nonzero | SEC not possible |
| nonzero | nonzero | Perform SEC |
FIGURE 24

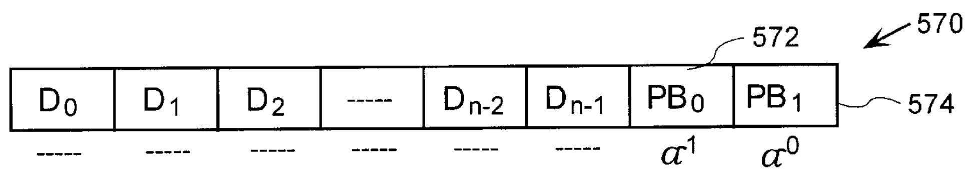
FIGURE 25
580
| P_ADR | Contents | |
|---|---|---|
| 0 | $S_1$ | $S_0$ |
| 1 | $S_1$ | $S_0$ |
| 2 | $S_1$ | $S_0$ |
| -- | -- | -- |
| 40 | $S_1$ | $S_0$ |
| 41 | $S_1$ | $S_0$ |
| 42 | $S_1$ | $S_0$ |
FIGURE 26
580
| P_ADR | Contents | |
|---|---|---|
| 0 | $PB_1$ | $PB_0$ |
| 1 | $PB_1$ | $PB_0$ |
| 2 | $PB_1$ | $PB_0$ |
| -- | -- | -- |
| 40 | $PB_1$ | $PB_0$ |
| 41 | $PB_1$ | $PB_0$ |
| 42 | $PB_1$ | $PB_0$ |
FIGURE 27
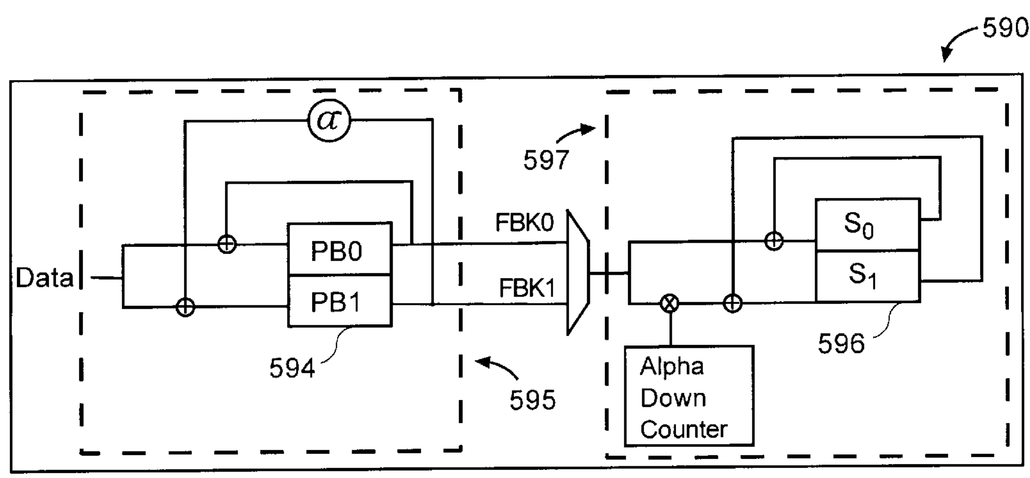
FIGURE 28

| Q_ADR | Contents | |
|---|---|---|
| 0 | $S_1$ | $S_0$ |
| 1 | $S_1$ | $S_0$ |
| 2 | $S_1$ | $S_0$ |
| -- | -- | -- |
| 40 | $S_1$ | $S_0$ |
| 41 | $S_1$ | $S_0$ |
| 42 | $S_1$ | $S_0$ |

| Q_ADR | Contents | |
|---|---|---|
| 0 | $PB_1$ | $PB_0$ |
| 1 | $PB_1$ | $PB_0$ |
| 2 | $PB_1$ | $PB_0$ |
| -- | -- | -- |
| 23 | $PB_1$ | $PB_0$ |
| 24 | $PB_1$ | $PB_0$ |
| 25 | $PB_1$ | $PB_0$ |

METHOD AND APPARATUS FOR PERFORMING ERROR CORRECTION CODE OPERATIONS

TECHNICAL FIELD

This invention relates generally to digital data storage and transmission, and more particularly methods and apparatus for implementing error control codes for data storage and transmission.

BACKGROUND ART

The CD-ROM and recordable CD, i.e., CD-R, evolved out of the original audio CD. In general, CD-ROMs and CD-Rs are considered to be pervasive and ubiquitous media because of their ability to store large amounts of data, typically over 630 MB of data.

Relatively high error rates are often associated with optical media such as the audio CD (ie., CD Audio), the CD-ROM, and CD-R. In order to address and reduce the relatively high error rates, the CD Audio conventionally included a Cross-Interleaved Reed-Solomon Code (CIRC) to reduce the error rate to an acceptable rate for audio material.

The CD-ROM and CD-R were, in terms of sectoring, designed to overlay the basic physical structure of the CD Audio. For error compensation, the CD-ROM and CD-R retained the Cross-Interleaved Reed-Solomon code but added an additional Reed-Solomon Product Code (RSPC) to accommodate the more stringent error rates required for computer data storage, as specified in the ISO/IEC 10149:1995(E) standard of ISO/IEC, which is incorporated herein by reference.

As computers have become faster, the need for transferring information from the CD-ROM and CD-R at higher rates has increased as well. In order to achieve a higher rate of information transfer, CD-ROM/CD-R drive manufacturers have increased the rotational speed of the CD-ROM/CD-R drives.

Since CD-ROM/CD-R drives are attached to and, therefore, interface with computers, it is generally necessary to have an interface controller to process the data from the CD-ROM/CD-R and deliver the data to an associated computer. Figure la shows a typical system block diagram for an interface controller that is associated with a CD-ROM and a CD-R which is in read mode. A CD-ROM 110 is in communication with a disk interface 112. Since a CD-R is recordable, it has a read mode and a write mode. As such, it should be appreciated that when a CD-R is in read mode, the data flow is from the CD-R to host interface 114, as it is for CD-ROM 110.

Data read from CD-ROM/CD-R 110 is passed through a DRAM 113, which is a memory. Data may be stored in DRAM 113, which is in communication with an error control coding (ECC) arrangement 115 that is used to reduce the error rate associated with data stored in DRAM 113. ECC 115 generally includes a Reed-Solomon decoder, as will be appreciated by those skilled in the art. From DRAM 113, data is provided to a host interface 114.

While the data flow for a CD-R in read mode and a CD-ROM is from the CD-ROM/CD-R to a host, the data flow for a CD-R in write mode, alternatively, is from the host to the CD-R. FIG. 1*b* is a typical system block diagram for an interface controller that is associated with a CD-R which is in write mode. A host interface 130 provides data to a DRAM 132, which is in communication with an ECC 134. A disk interface 136 reads data from DRAM 132 and writes the data onto a CD-R 138.

Part of the process of passing data between a CD-ROM/CD-R and a host includes ECC operations which are generally used to recover useful data from the CD-ROM/CD-R in the presence of errors. Although the errors can be widely varied, examples of such errors include scratches, fingerprints, and manufacturing imperfections of the physical media.

ECC is generally based on mathematical principles and, as such, entails performing a large number of complex arithmetic computations at high speeds. As the rotational speed of CD-ROM/CD-R drives has increased, the demand placed upon interface controllers has increased as well, since interface controllers must be capable of processing data at much higher rates. The principal impediment to operating the interface controller at high data rates has been the difficulty of performing ECC operations at the increasingly high data rates.

Data on a CD-ROM/CD-R is typically organized as sectors, each of which includes 2352 bytes, as described in the above-mentioned ISO/IEC 10149:1995(E) standard. In general, three types of sectors exist, each with a different data organization. Of the three types of sectors, one type of sector is protected by a Reed-Solomon Product Code. FIG. 2 indicates the physical layout of a sector that can be protected by a Reed-Solomon Product Code or, more generally, an ECC. A sector 202 includes data 204 and parity bytes 206*a–b,* which will be described in more detail below. As shown, sector 202 includes 2076 bytes of data 204. Data 204 occupy overall bytes "0" through "2063" from the beginning of the data field, while the 172 P-parity bytes 206*a* occupy bytes "2064" through "2235" from the beginning of the data field, and the 104 Q-parity bytes 206*b* occupy bytes "2236" through "2339" of the data field. The location of data 204 and parity bytes 206 have, therefore, a relative byte offset from the beginning of the data field. Data 204 is protected by ECC, while parity bytes 206*a–b* are used for ECC. As will be appreciated by those skilled in the art, the sync bytes of sector 202 are not included in the ECC encoding, and are not protected by ECC.

In a typical system, data from a CD-ROM/CD-R is read into a word-wide dynamic memory (DRAM) using a mapping between memory word addresses and relative byte offsets. Such a mapping is shown in FIG. 3. Memory addresses 210 are mapped into relative byte offsets 212, where byte offsets 212 are divided in terms of even bytes 213 and odd bytes 214.

A CD-ROM/CD-R ECC segments a sector into two separate but identical encodings which separately span even and odd bytes. That is, using the DRAM memory addresses as shown in FIG. 3, all the even bytes can be segregated together and encoded by a Reed-Solomon Product Code, and all the odd bytes can be segregated together and encoded by a Reed-Solomon Product Code, as indicated in FIG. 4. That is, even, or odd, data bytes 220, which are protected by ECC, can be segregated together along with their associated P-parity bytes 222 and Q-parity bytes 224.

As previously mentioned, a CD-ROM/CD-R specifies a Reed-Solomon Product Code. The specification of a Reed-Solomon Product Code implies that there are two dimensions, which are referred to as "P" and "Q." With reference to FIG. 5, the Reed-Solomon Product Code data organization of even or odd bytes, which are taken separately, of a sector will be described. Specifically, the data organization of a Reed-Solomon Product Code will be described in terms of the manner in which ECC encoding is performed. The construction of the Reed-Solomon Product code involves creating a matrix of data 228, which has 43 columns 229 and 24 rows 230. Elements in cells 232 correspond to word, or memory, addresses for DRAM data organization as shown in FIG. 3.

The data in each column 229 includes 24 bytes, and is encoded by a single-error correcting Reed-Solomon code, and two parity bytes for each column 229 are placed in rows 230*h* and 230*i* in column 229 over which the encoding has taken place. Each newly formed codeword is a separate P codeword. Therefore, there are 43 such codewords, corresponding to the 43 columns 229. For purposes of explanation, each individual P codeword will referenced as $P^i$, where i ranges from 0 to 42.

The encoding of individual P codewords represents one dimension of the Reed-Solomon Product Code. The second dimension of the Reed-Solomon Product Code involves encoding data lying along the diagonals of matrix 228. For the second dimension, which encodes Q codewords, the "data," which consists of 43 bytes, includes some of the parity bytes of the P codewords, as will be described in more detail with respect to FIG. 6.

FIG. 6 illustrates the manner in which the Q codewords are typically constructed by presenting two specific Q codewords. FIG. 6 is a partial representation of matrix 228 of FIG. 5. That is, matrix 228' of FIG. 6 is essentially matrix 228 of FIG. 5, without Q-parity rows 230*k* and 230*l*. The first Q codeword 240 starts in row 0, column 0 of matrix 228' and proceeds down the diagonal until Q codeword 240 reaches column 25, row 24, at which point Q codeword 240 continues from row 0, column 26 until Q codeword 240 terminates at row 16, column 42. It should be appreciated that parity bytes associated with P codewords in matrix 228', which are located in rows 24 and 25, are also included in Q codeword 240. The two parity bytes for Q codeword 240 are placed in Q-parity positions associated with matrix 228'. That is, Q parity bytes for Q codeword 240 are placed in row 230*k* (location 1118) and row 2301 (location 1144), at column 229*a,* as shown in FIG. 5.

Another Q codeword 242 starts in row 20. As before, Q codeword 242 moves down matrix 228'. Q codeword 242 moves from row 20, column 0 at a diagonal until row 25, column 5 is reached. Then, Q codeword 242 continues from row 0, column 6, moving at a diagonal down to row 25, column 31. Q codeword 242 then continues from row 0, column 32 along a diagonal until row 10, column 42 is reached. As was the case for Q codeword 240, P parity bytes are included in Q codeword 242. Specifically, P parity bytes located at row 24, column 4, as well as P-parity bytes at row 25, column 6, P-parity bytes at row 24, column 30 and P-parity bytes at row 25, column 31, are all included as a part of Q codeword 242. The two parity bytes for Q codeword 242 are placed in row 230*k* (location 1138) and row 2301 (location 1164), of matrix 228, as shown in FIG. 5.

In total, there are 26 Q codewords, corresponding to each of the 26 rows of matrix 228'. That is, the first element of each Q codeword, as for example Q codeword 240, starts in column 0 of each row. The 26 Q codewords which correspond to rows of a matrix is in contrast to the 43 P codewords which correspond to each of the columns of a matrix, as described above with respect to FIG. 5. For purposes of explanation, each individual Q codeword will referenced as $Q^j$, where j ranges from 0 to 25.

As previously mentioned, each dimension, i.e., P and Q, of the Reed-Solomon Product Code is encoded by a single-error correcting (SEC) Reed-Solomon code. In order to encode the dimensions, a CD-ROM/CD-R typically uses a Galois Field (i.e., $GF(2^8)$) generated by the following primitive polynomial:

$$p(x)=x^8+x^4+x^3+x^2+1$$

where the primitive element of $GF(2^8)$ is: $\alpha=(00000010)$. The same SEC Reed-Solomon code is used for both the P codewords and Q codewords. The SEC Reed-Solomon code is generated using the following generator polynomial:

$$g(x)=(x+\alpha^1)(x+\alpha^0)$$

For a typical CD-ROM/CD-R interface controller, the steps for performing error corrections involve first computing the partial syndromes for each $P^i$ codeword and then performing SEC on each $P^i$ codeword, whenever possible. When the partial syndromes are computed, and SEC is performed, each $p^i$ codeword is processed one at a time, and the errored byte corrected in memory. Then, after all the P codewords are processed, the partial syndromes for each $Q^i$ codeword are computed, and SEC is performed whenever possible. As was the case for the P codewords, each $Q^i$ codeword is processed one at a time, and the errored byte is corrected in memory. The partial syndromes for the P codewords and Q codewords are calculated and SEC is performed whenever possible until either all the partial syndromes are zero, indicating no more detectable errors, or a repetition count associated with the computations expires. FIG. 7 illustrates the preceding steps, where the index i refers to the columns, and index j refers references each Q codeword.

A received polynomial r(x) is the combination of an original codeword and any errors which might have been introduced within the original codeword. In other words, r(x)=c(x)+e(x), where c(x) is the originally generated codeword, and e(x) is the error polynomial which represents any error introduced within the original codeword. Since two factors make up the generator polynomial, due to the fact that a SEC Reed-Solomon code is being implemented, two partial syndromes, $S_0$ and $S_1$ can be calculated. The two partial syndromes are calculated by evaluating the received polynomial, r(x) , at each of the factors of the generator polynomial g(x), namely $\alpha^0$ and $\alpha^1$. As such, the following expressions for partial syndromes $S_0$ and $S_1$ can be obtained:

$$S_0=r(\alpha^0)=c(\alpha^0)+e(\alpha^0)$$

$$S_1=r(\alpha^1)=c(\alpha^1)+e(\alpha^1)$$

By definition, the originally generated codeword c(x) evaluated at $\alpha^0$ and $\alpha^1$ are zero, i.e., $c(\alpha^0)=0$ and $c(\alpha^1)=0$, since $\alpha^0$ and $\alpha^1$ are factors of generator polynomial g(x). As such, partial syndromes $S_0$ and $S_1$ can also be expressed as:

$$S_0=r(\alpha^0)=e(\alpha^0)$$

$$S_1=r(\alpha^1)=e(\alpha^1)$$

In general, the received polynomial, r(x), is represented as follows:

$$r(x)=r_{n-1}x^{n-1}+r_{n-2}x^{n-2}+\ldots+r_1x^1+r_0x^0$$

where the $r_i$ are the data from a DRAM and are, therefore, the original data combined with the error data, and n is the length of the codeword. As such, partial syndromes $S_0$ and $S_1$ can further be expressed as $$S_0 = r(\alpha^0) = r_{n-1}\alpha^0 + r_{n-2}\alpha^0 + \ldots + r_1\alpha^0 + r_0\alpha^0$$

$$= r_{n-1} + r_{n-2} + \ldots + r_1 + r_0$$

$$S_1 = r(\alpha^1) = r_{n-1}\alpha^{n-1} + r_{n-2}\alpha^{n-2} + \ldots + r_1\alpha^1 + r_0\alpha^0$$

An alternative method of evaluating the received polynomial r(x) is by the use of Horner's rule, which is a recursive multiply and add algorithm, as will be appreciated by those skilled in the art. In this regard, the partial syndrome equations can be rewritten in the following form:

$$S_i=((\ldots(r_{n-1}\alpha^i+r_{n-2})\ \alpha^i+r_{n-3})\ \alpha^i+\ldots+r_1)\ \alpha^i+r_0$$

The usual procedure for computing the partial syndromes is to use the circuit in FIG. 8, which directly implements Horner's rule. A partial syndrome calculation circuit 270 includes a separate circuit, as for example circuits 274, 276, for each partial syndrome that is to be calculated. The coefficients of received polynomial r(x) are sequentially transmitted to partial syndrome calculation circuit 270, where the coefficients of received polynomial r(x) are passed through modulo-2 adders 278, 279, which are implemented by exclusive OR circuits. It should be appreciated that adders 278, 279 are generally identical. The output from adder 278 is multiplied by root $\alpha^0$ 280 of generator polynomial g(x), in order to obtain partial syndrome $S_0$. Likewise, the output from adder 279 is multiplied by root $\alpha^1$ 217 to obtain partial syndrome $S_1$. Once obtained, the partially computed partial syndromes $S_0$ and $S_1$ are clocked into flip-flops 282, 283.

It should be appreciated that substantially all arithmetic operations are over GF($2^8$) such that addition is performed modulo 2. Addition is, therefore, implemented by an exclusive or gate, which is denoted by the $\oplus$ symbol. In addition, fixed Galois Field multiplication is implemented as well. The use of the symbol $\otimes$ indicates Galois Field multiplication performed in GF($2^8$).

Circuit 270 of FIG. 8 relies upon the proper ordering of the elements of the codewords. As such, circuit 270 only serves its intended purpose if the elements clocked into the circuit are in sequential order, from the first element to the last element.

An error correction operation is performed once partial syndromes $S_0$ and $S_1$ are calculated. In the event that either partial syndromes $S_0$ or $S_1$ are non-zero, then an error has occurred. If a single random error has occurred, then one of the $r_i$ contains the error, where i identifies the relative location within the codeword which is in error. When a single random error has occurred, then partial syndromes $S_0$ and $S_1$ can be expressed in terms of the value of the random error and the error location as follows:

$$S_0=v$$

$$S_1=v\otimes\alpha^i=S_{0pullout;zu270400.001\alpha}^{\ i}$$

where v is the error value and i is the error location. To isolate the error location i, the following expression can be used:

$$i=\log_\alpha(S_1/S_0)$$

Once i is determined, the original data can be recovered by adding the value of $S_0$ to the data read from memory at location "i." This operation is performed modulo-2, as will be appreciated by those skilled in the art.

The coefficients of received polynomial r(x) represent the elements of a codeword. When an error is present, the location of the error is determined by the procedure described above. The locations are represented by elements of GF($2^8$), as shown in FIG. 9. As shown, the $\alpha^i$ are labels for the possible error locations of the codeword. If there is an error in $r_{n-3}$, for example, the location of the error is referenced as $\alpha^2$, which is the result that would be obtained by calculating 'i' as described above.

An example of a P codeword, located in column 42 of data matrix 228 is shown in FIG. 10. In FIG. 10, a row 290 contains DRAM addresses of bytes which make up the P codeword. Due to the fact that the even bytes and the odd bytes are treated separately, it should be appreciated that FIG. 10 can refer to either even bytes or odd bytes.

A second row 292 refers to each coefficient of a received polynomial. In this case, any $r_k$ could contain an error, in which case the value obtained from the DRAM would be $d_k \oplus e_k$, where $d_k$ is the original encoded data and $e_k$ is the error pattern introduced. The two parity bytes of the codeword represented in row 290 are located in cells 293, 294. A third row 296 contains labels, which are elements of GF($2^8$), that identify each location of the received polynomial r(x) as a solution for a corresponding error location equation.

As previously mentioned, the operation of the partial syndrome calculation circuit of FIG. 8 requires that the data passed into the circuit is in the proper order, i.e., in the same order in which the original data is encoded. In this regard, the data from a DRAM must be read non-sequentially such that the data can correspond to the same order of bytes making up a codeword. This non-sequential access of data is not as efficient as a sequential access of data due to the fact that DRAMs have a mode of operation called Page Mode which allows data to be accessed much faster when the data is located in consecutive locations within the memory. Hence, the calculation of partial syndromes, as discussed above, causes inefficiency in CD-ROM/CD-R interface controllers since a non-sequential access of data requires more memory bandwidth for obtaining the data from the DRAM.

In general, the inefficiency in CD-ROM/CD-R interface controllers can be attributed to two sources. Once source of inefficiency is due to the fact that each data byte generally must be read twice. That is, each data byte must be read once to calculate the P partial syndromes, and a second time to compute the Q partial syndromes. This is due to the fact that partial syndromes for the P codewords are calculated separately from partial syndromes of the Q codewords, although each data byte is simultaneously used to encode both a P codeword and a Q codeword. Another source of inefficiency is that the calculation of the partial syndromes are made by non-sequential accesses such that the faster Page Mode access method cannot be used.

A typical approach to performing the ECC functions also requires that multiple passes be made through memory in order to perform error correction operations, as shown in FIG. 7. In this regard, each iteration pass through memory involves recalculating the partial syndromes, which uses up a considerable amount of memory bandwidth, as mentioned above. One consequence associated with repeated passes through memory is that less memory bandwidth is available for reading additional sectors of data from the CD-ROM/CD-R and for delivering the corrected data to a host, since the DRAM is the central repository.

In general, conventional approaches to performing ECC operations involve two separate passes through memory for each iteration of the correction process to calculate the partial syndromes for each of the P codewords and each of the Q codewords. Multiple iterations are required, thereby leading to additional DRAM memory accesses. Each memory access is a non-sequential access which is much less efficient than using a Page Mode access method. As such, the maximum transfer rate of data from a CD-ROM/CD-R to a host is often limited due to the high DRAM memory bandwidth required by the ECC operations.

For a CD-R, it is requirement for data to be written onto the disk in the same format as for CD-ROM. Hence, it is necessary to generate parity bytes for all of the associated P codewords and Q codewords. In a conventional approach to writing data onto a CD-R, data from a host computer is placed into the DRAM main memory, as described above with respect to FIG. 1*b*. Once data is placed into the main memory, the EDAC then accesses the data and computes the P parity bytes and Q parity bytes. As was the case for the typical approach taken with respect to a CD-ROM, the individual data making up the codewords for each dimension are accessed in non-sequential fashion, I.e., one after the other, such that the appropriate parity bytes are computed during each access. The parity bytes are then written into memory. It should be appreciated that such a process implies making two non-sequential passes through memory.

An example of a standard circuit for generating parity bytes is shown in FIG. 11. Circuit 302 relies upon the proper ordering of the data bytes since the parity bytes are computed in "byte-serial" fashion. Data is passed through an exclusive OR 304, which functions as modulo-two adder. The output from adder 304 is separately multiplied by $\alpha$306 and clocked into flip-flop 312. The output from adder 304 is also multiplied by $\alpha^{25}$308, passed through an adder 311, and clocked into flipflop 310.

In circuit 302, the input data, or DataIn 314, comes from DRAM. The bytes in DataIn 314 are clocked into circuit 302 which performs a byte-serial division of the data using the following generator polynomial g(x):

$$g(x)=(x+\alpha^0)(x+\alpha^1)$$

After the last data byte is inputted to circuit 302, the two flip-flops 310, 312 hold the remainder of the division, which are the parity bytes. The parity bytes can then be written out to the DRAM. The result of the byte-serial division operation is to create, or encode, a Reed-Solomon codeword in systematic form. That is, the byte-serial division allows the original data to be included in the computed codeword, with the parity bytes "tacked on" to the end of the data.

The systematic form of a Reed-Solomon codeword is generally computed as follows:

$$c(x)=(d(x)*x^2 \text{modulo } g(x))+d(x)*x^2$$

where c(x) is the Reed-Solomon codeword, d(x) is the data, and g(x) is the generator polynomial. As shown in the above expression, data d(x) is first pre-multiplied by $x^2$ and divided by g(x). Then, the results of the pre-multiplication and division are added to $d(x)*x^2$.

The computation of P and Q codewords associated with writing data onto a CD-R requires two non-sequential passes through memory, as well as separate circuitry that must be used in addition to the syndrome computation circuits.

The maximum transfer rate of data from a CD-ROM/CD-R to a host or from a host to a CD-R is often limited due to the high DRAM memory bandwidth required by the ECC operations. Therefore, as the general demand for high-speed CD-ROM and CD-R is always increasing, what is desired is a method and an apparatus for efficiently implementing ECC without requiring a high DRAM memory bandwidth. Specifically, what is desired is a method and an apparatus for efficiently calculating partial syndromes for use in a Reed-Solomon encoder and decoder.

DISCLOSURE OF THE INVENTION

A method for calculating partial syndromes for codewords that are used in error control coding enables partial syndromes to be computed using a single, sequential access to data bytes stored in memory. Partial syndromes, as well as intermediate values for the partial syndromes, are held in buffers where they can be readily accessed. Allowing a single, sequential access to data bytes stored in memory increases the efficiency of partial syndrome computations.

A method for processing encoded data using error control coding in accordance with the present invention includes: a) obtaining Q codewords and P codewords from a storage location, wherein the Q codewords and the P codewords are all obtained in a single pass through the storage location, b) calculating P partial syndromes for said P codewords, c) calculating Q partial syndromes for the Q codewords, and d) storing the Q partial syndromes and the P partial syndromes in a buffer that is separate from the main memory. In some embodiments, storing the Q partial syndromes and the P partial syndromes in the buffer includes storing the Q partial syndromes in a first buffer, and storing the P partial syndromes in a second buffer. In such embodiments, a plurality of intermediate values for P partial syndromes can be stored in the first buffer, and a plurality of intermediate values for Q partial syndromes can be stored in the second buffer, where the values can be accessed during partial syndrome computations.

An apparatus for processing data encoded using error control coding in accordance with the present invention includes a main memory being arranged to hold he encoded data, and circuitry arranged to access said main memory to retrieve the encoded data. The circuitry is also arranged to process the encoded data, which is formatted as codewords, and includes a partial syndrome calculation circuit that is arranged to compute partial syndromes for the codewords. The partial syndrome calculation circuit further includes a buffer arrangement arranged to store the partial syndromes after the partial syndromes are calculated using a single access to the main memory. In one embodiment, the buffer arrangement includes a first buffer arranged to store the partial syndromes computed for the P codewords and a second buffer arranged to store the partial syndromes computed for the Q codewords.

These and other advantages of the present invention will become apparent upon reading the following detailed descriptions and studying the various figures of the drawings.

BRIEF DESCRIPTION OF THE DRAWINGS

FIG. 3 is a table which shows the mapping between DRAM words and sector bytes.

FIG. 4 is a representation of bytes in a sector which are protected by and used for error control coding.

FIG. 5 is a representation of a data matrix from which columnar and diagonal codewords are generated.

FIG. 12 is a table which lists symbols associated with error control coding in accordance with an embodiment of the present invention.

FIG. 16 is a representation of a data matrix which shows the identification of P codewords in accordance with an embodiment of the present invention.

FIG. 17 is a representation of a data matrix which shows the identification of Q codewords in accordance with an embodiment of the present invention.

FIG. 18 is a representation of the contents of a P buffer in accordance with an embodiment of the present invention.

FIG. 22 is a representation of the contents of a Q buffer in accordance with an embodiment of the present invention.

FIG. 23 is a block diagram of one circuit which is suitable for use in computing $S_1$ partial syndromes for Q codewords in accordance with an embodiment of the present invention.

FIG. 24 is a tabular representation of SEC actions in accordance with one embodiment of the present invention.

FIG. 25 is a representation of a codeword in which parity bits have been erased in accordance with an embodiment of the present invention.

FIG. 26 is a representation of the contents of a P buffer after partial syndromes have been computed in accordance with an embodiment of the present invention.

FIG. 27 is a representation of the contents of a P buffer after erasure decoding has been performed in accordance with an embodiment of the present invention.

FIG. 28 is a block diagram which illustrates the feedback connections, associated with a P buffer, that are used in the computation of Q partial syndromes in accordance with an embodiment of the present invention.

BEST MODES FOR CARRYING OUT THE INVENTION

Figure 1A:
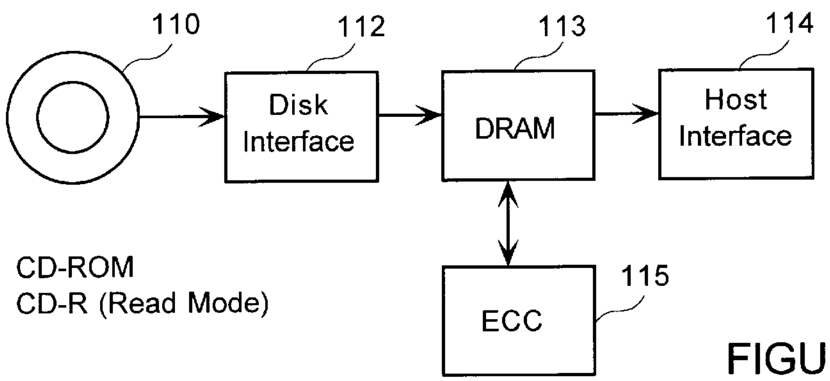
FIG. 1*a* is a representation of the interface between a CD-ROM or a CD-R in read mode and a host.
Figure 1B:
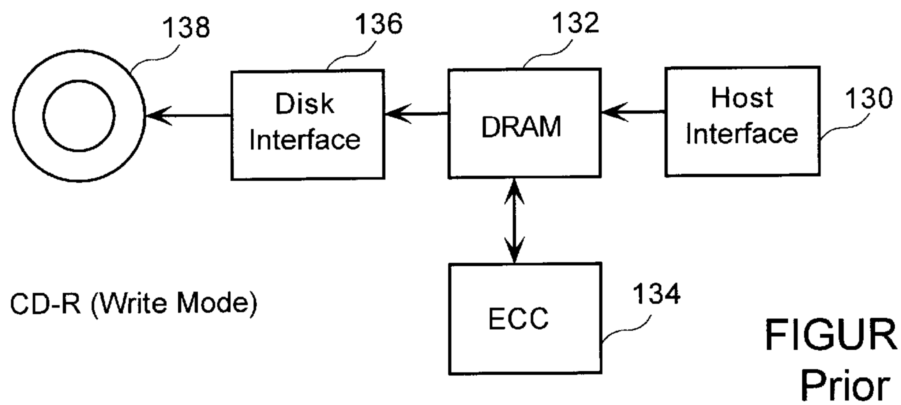
FIG. 1*b* is a representation of the interface between a host and a CD-R in write mode.
Figure 2:
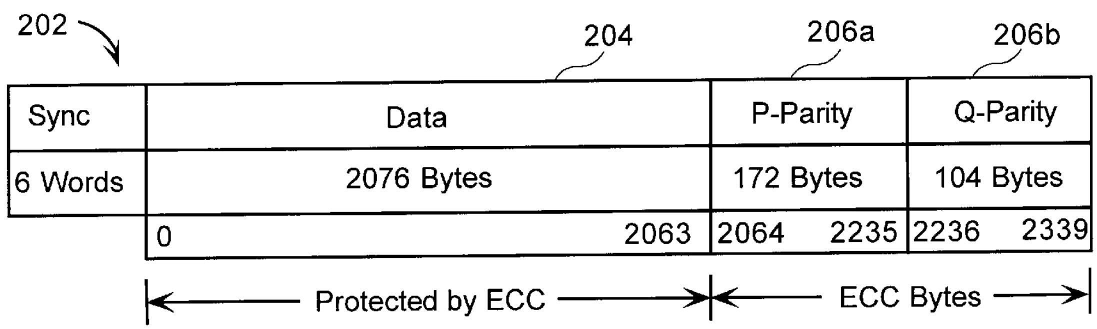
FIG. 2 is a representation of a sector of a CD-ROM or CD-R.
Figure 6:
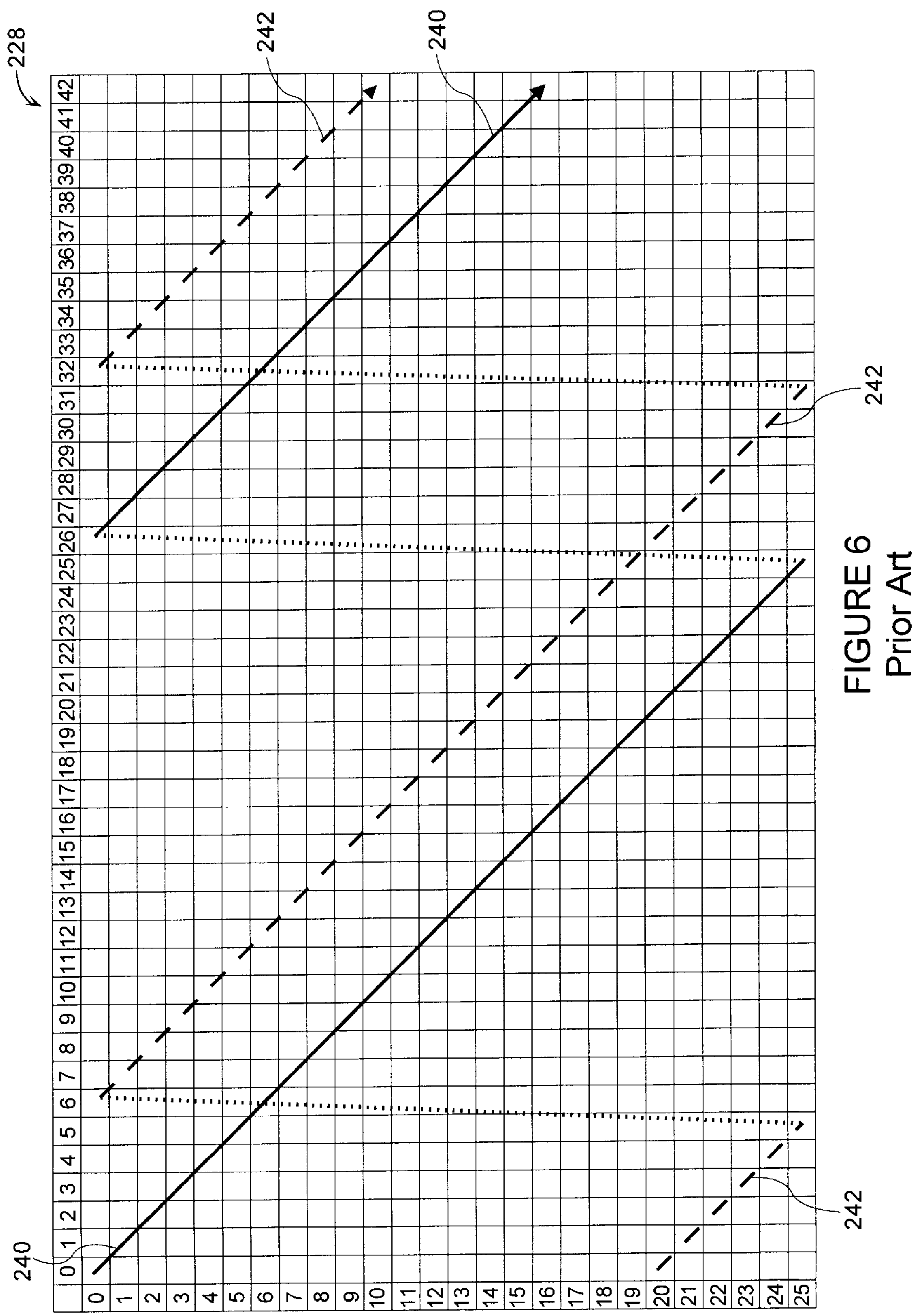
FIG. 6 is a representation of a portion of the data matrix of FIG. 5 which shows the construction of Q codewords.

FIGS. 1*a* and 1*b* are block diagram representations of systems which use Reed-Solomon codes for error correction and were discussed previously. FIG. 2 is a representation of a sector of a CD-ROM or CD-R, FIG. 3 is a table which shows the mapping between DRAM words and sector bytes, FIG. 4 is a representation of bytes in a sector which are protected by and used for error control coding, FIG. 5 is a representation of a data matrix from which columnar and diagonal codewords are generated, and FIG. 6 is a representation of a portion of the data matrix of FIG. 5 which shows the construction of Q codewords, all of which were also discussed previously.

Figure 7:
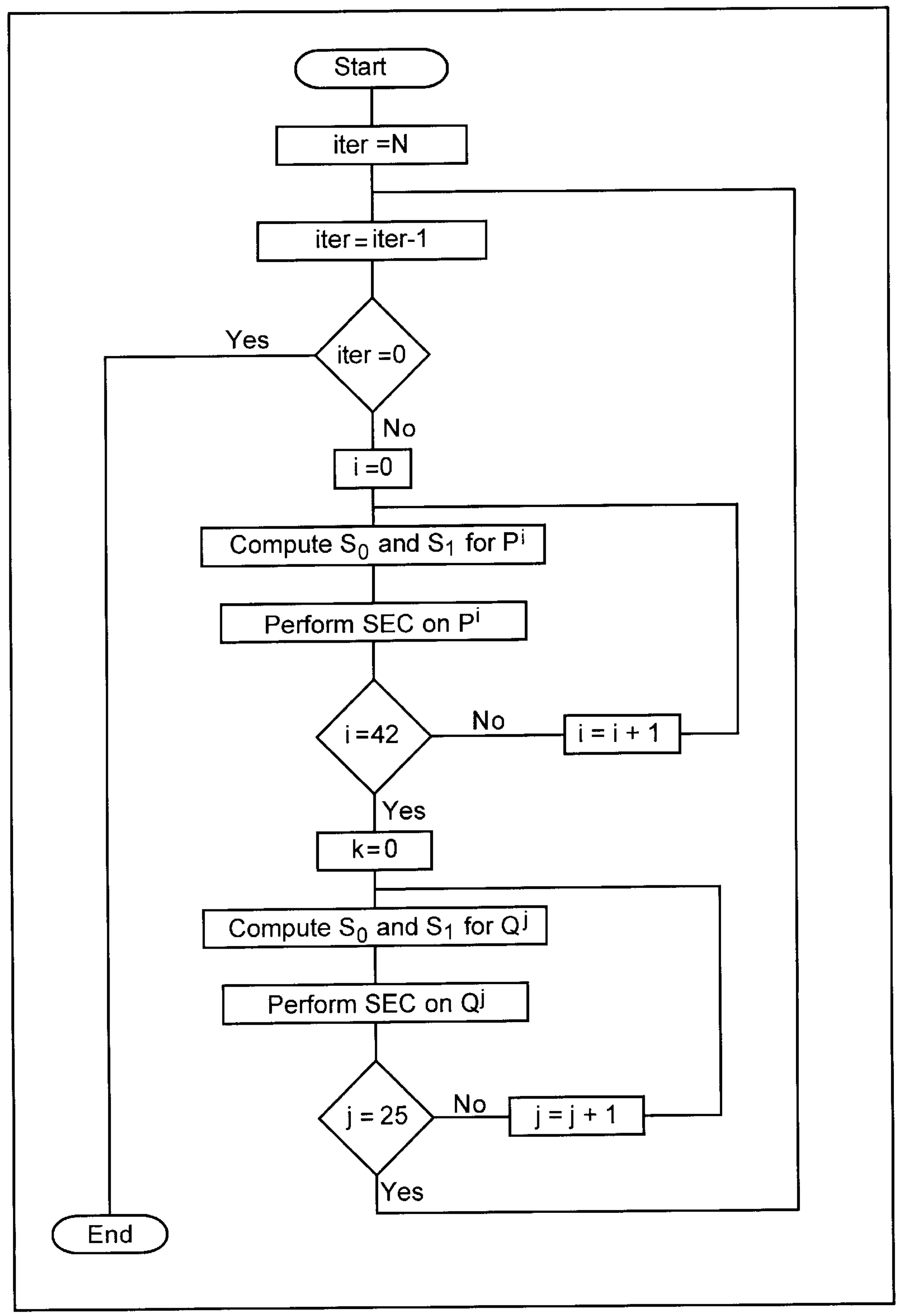
FIG. 7 is a process flow diagram which illustrates the steps associated with calculating syndromes in accordance with prior art.
Figures 8, 9, 10:
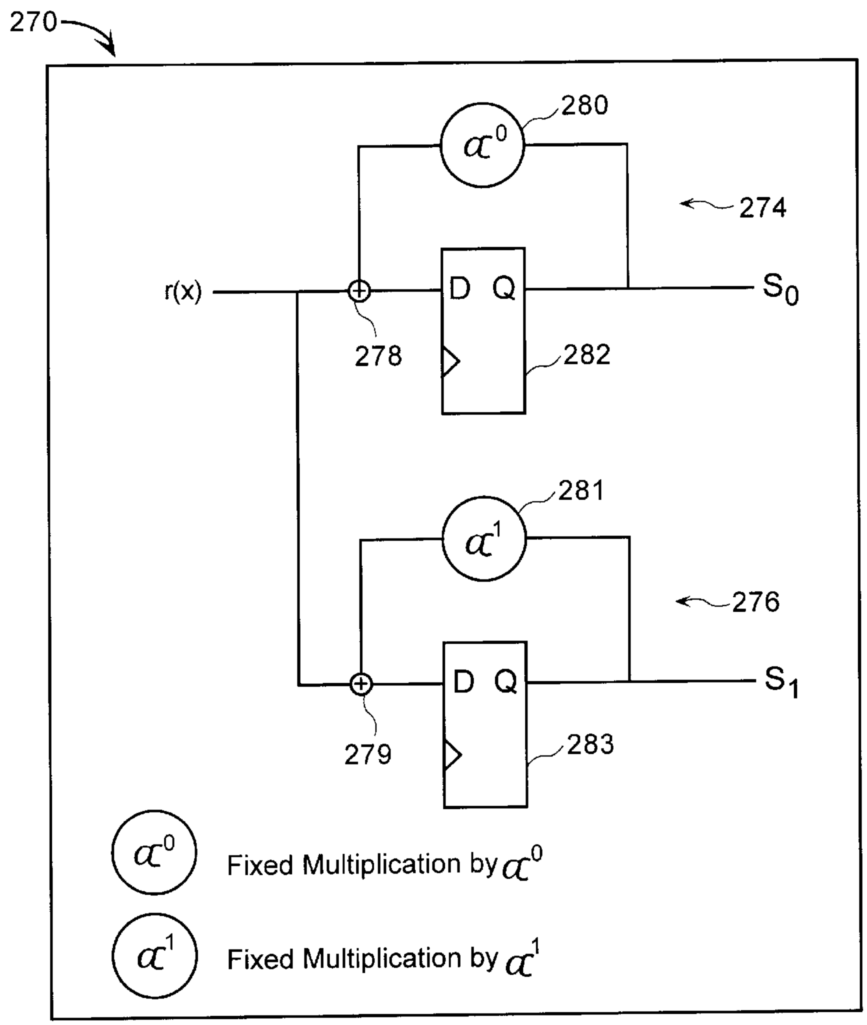
FIG. 8 is a circuit diagram of a circuit which is used to recursively calculate partial syndromes for use with Reed-Solomon codes for error correction in accordance with prior art.
FIG. 9 is a representation of the relationship between solutions to an error location polynomial and coefficients of a received polynomial.
FIG. 10 is a representation of the possible error location values for a specific P codeword.
Figure 11:
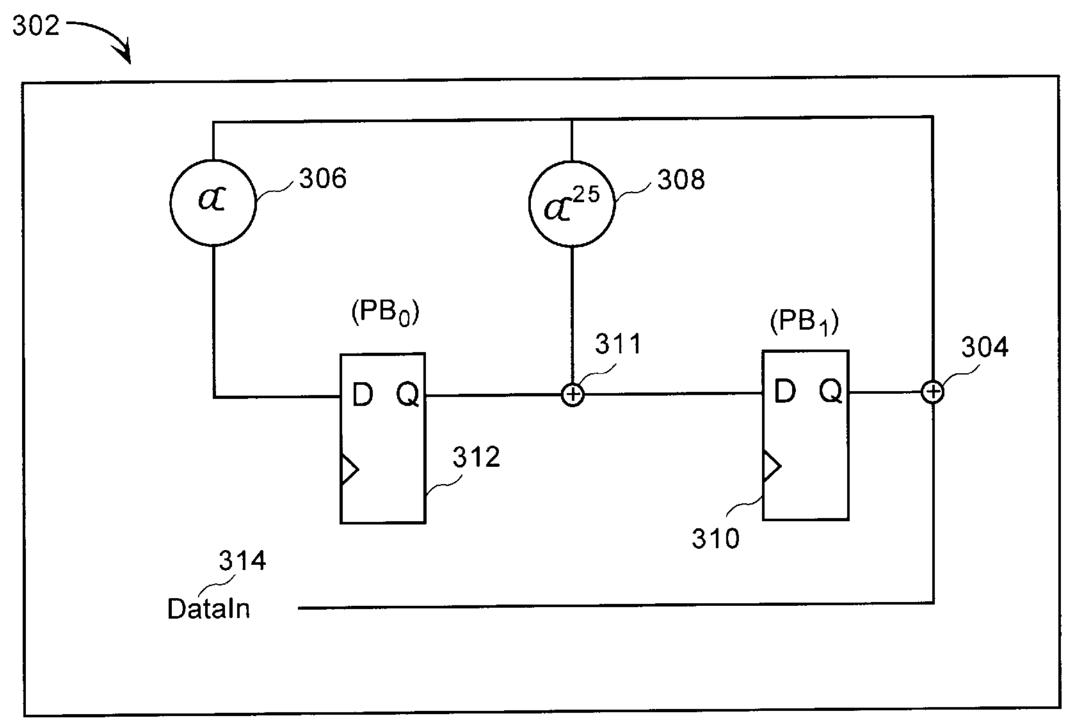
FIG. 11 is a circuit which is used to generate parity bytes in accordance with prior art.

FIG. 7 is a process flow diagram which illustrates the steps associated with a prior art process of calculating partial syndromes, FIG. 8 is a circuit diagram of a prior art circuit which is used to recursively calculate partial syndromes for use with Reed-Solomon codes for error correction, FIG. 9 is a representation of the relationship between solutions to an error location polynomial and coefficients of a received polynomial, FIG. 10 is a representation of the possible error location values for a specific P codeword, FIG. 11 is a prior art circuit which is used to generate parity bytes, and were all also previously discussed. FIG. 12 is a tabular representation of the terminology and nomenclature which will be used herein and below.

In order to more efficiently compute the partial syndromes and perform correction operations, the partial syndromes for each P codeword and each Q codeword can be computed using only a single sequential pass through memory. The partial syndromes for each of the P codewords are then stored in a separate buffer P_BUF, while the partial syndromes for each of the Q codewords are stored in a separate buffer Q_BUF. Substantially all correction operations can be performed using the partial syndromes in P_BUF and Q_BUF, without additional access to memory. Memory is only accessed again for the purpose of writing corrected values back into the memory.

Figure 13:
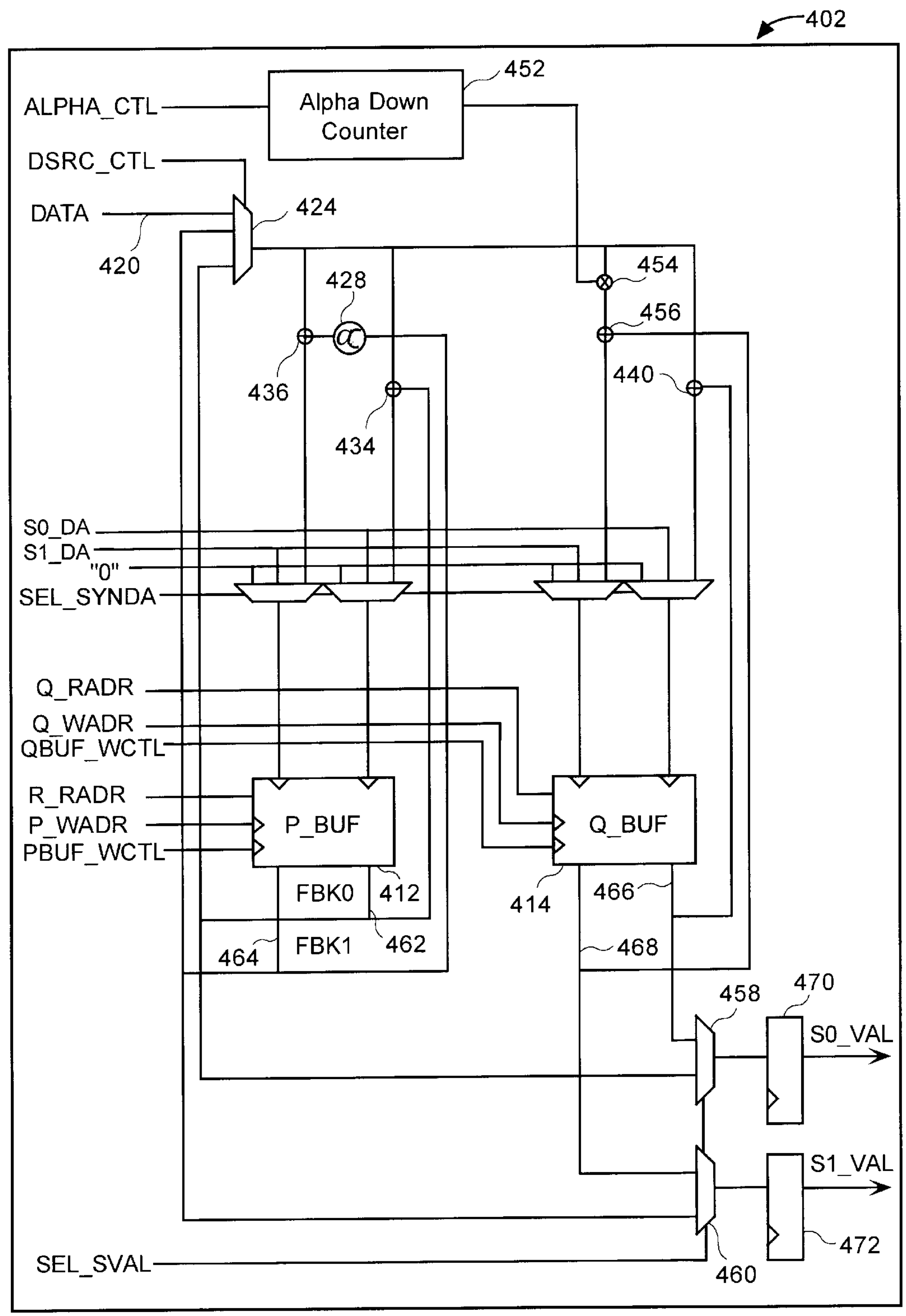
FIG. 13 is a circuit diagram of one circuit which is suitable for use in the calculation of partial syndromes in accordance with an embodiment of the present invention.

One circuit which is suitable for computing the partial syndromes for each of the P and Q codewords will be described with reference to FIGS. 13 and 14. FIG. 13 is a block diagram which illustrates a circuit that is used to compute the partial syndromes in accordance with an embodiment of the present invention. A partial syndrome computation circuit 402 includes a P_BUF 412 and a Q_BUF 414. P_BUF 412 is arranged to hold values for the P partial syndromes, while Q_BUF 414 is arranged to hold values for the Q partial syndromes.

P_BUF 412 and Q_BUF 414 are typically local memory buffers. In the described embodiment, P_BUF 412 is 43 locations long, with each location being arranged to hold partial syndromes. That is, each location i within P_BUF 412 is arranged to hold the two partial syndromes for codeword $P^i$. Q_BUF 414 is 26 locations long and is arranged such that each location j within Q_BUF 414 is holds the partial syndromes for codeword $Q^j$.

In the described embodiment, two sets of buffers are used to store the partial syndromes. One set is used for computing the partial syndromes for the low-order bytes and the other set is used to computing the partial syndromes for the high-order bytes. As shown, circuit 402 is suitable for use in either computing the partial syndromes for the low-order bytes or the high-order bytes. It should be appreciated that if it is desired to calculate the partial syndromes for the lower byte stream simultaneously with calculating the partial syndromes for an upper byte stream, circuit 402 can essentially be "duplicated," with some modifications, to enable the partial syndromes for the lower byte streams to be calculated at the same time as the partial syndromes for upper byte streams.

A data line 420 is clocked into a multiplexer 424 that is arranged to distribute data, or the bytes which make up a codeword, throughout circuit 402. In the described embodiment, the partial syndromes are calculated for a single error correction process. Therefore, as will be appreciated by those skilled in the art, two partial syndromes, $S_0$ and $S_1$, are typically calculated for each codeword. Syndrome $S_0$ is calculated by adding all data bytes, using exclusive OR 434, that are associated with a given codeword. It should be appreciated that prior to the calculation of the partial syndromes, P_BUF 412, as well as Q_BUF 414, are initialized with zero values in substantially every location. As each data byte passes through multiplexer 424, the contents of P_BUF 412 are accessed to locate the intermediate value which is associated with, or relevant to, a particular data byte, and added to the data byte. The mathematical expression for obtaining partial syndrome $S_0$ for P codewords can be expressed as follows:

$$S_0=d_{n-1}\oplus d_{n-2}\oplus \dots \oplus d_1\oplus d_0$$

where $d_m$ represents the elements of a P codeword, and n represents the length of the codeword. In the described embodiment, the codeword has a length of 26 elements, including redundancy bytes for P codewords.

Figure 19:
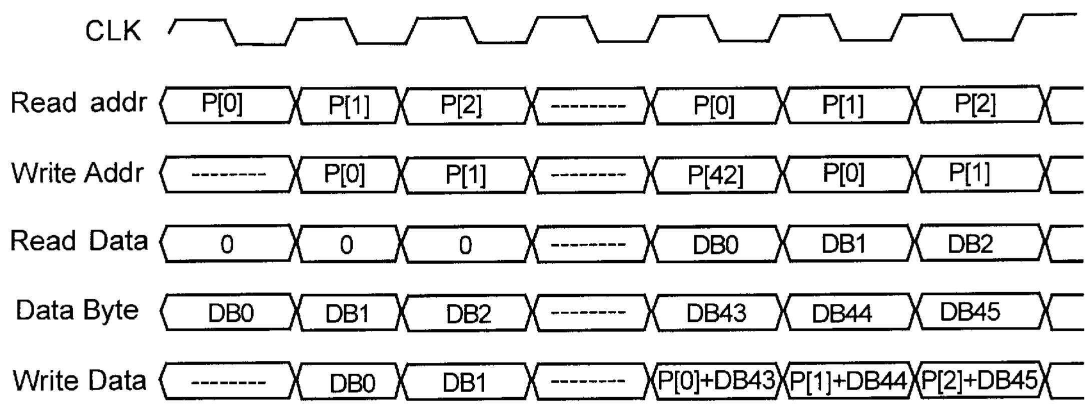
FIG. 19 is a timing diagram for a process of calculating So partial syndromes for P codewords in accordance with an embodiment of the present invention.

Once an intermediate value is updated, the updated intermediate value is rewritten back into P_BUF 412 at the same location from which the original intermediate value was obtained. It should be appreciated that once all relevant data bytes have been processed for a particular P codeword, the intermediate value corresponding to the P codeword, as stored in P_BUF 412, is partial syndrome $S_0$ for the P codeword. The overall timing associated with computing $S_0$ for storage in P_BUF 412 is shown in FIG. 19.

Figure 21:
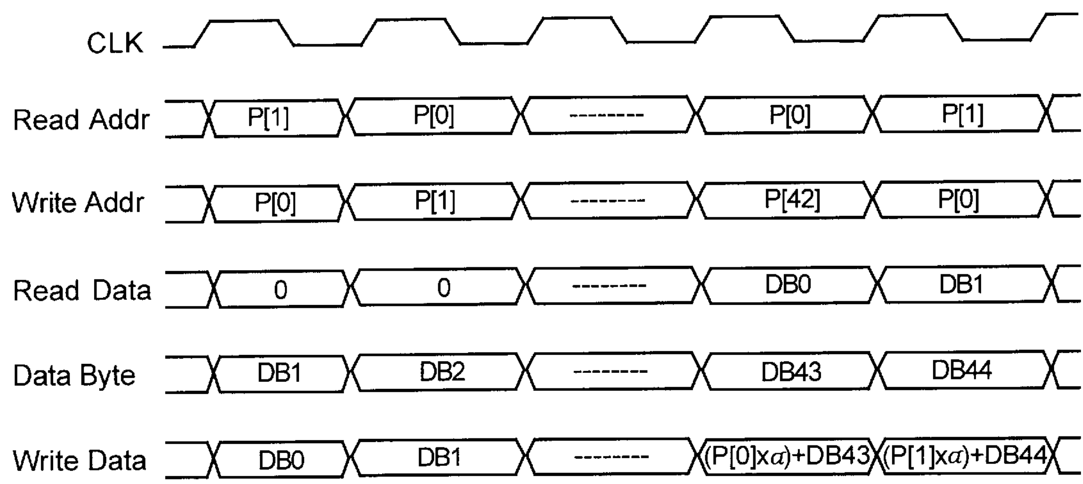
FIG. 21 is a timing diagram for a process of calculating $S_1$ partial syndromes for P codewords in accordance with an embodiment of the present invention.

To calculate the syndrome $S_1$ for the P codewords, the data bytes are recursively processed using a single α-multiplier 428. α-multiplier 428 is coupled to P_BUF 412 such that as an incoming data byte passes through multiplexer 424, the relevant contents of P_BUF 412 are read out, passed through multiplier 428, added to the incoming data byte using an exclusive OR 436, and written back into P_BUF 412. As intermediate values for P syndromes are stored in P_BUF 412, a single α-multiplier 428 is sufficient for calculating $S_1$ syndromes for P codewords. Once all the relevant data bytes for a P codeword are processed, the intermediate values stored in P_BUF 412 that relate to calculating partial syndrome $S_1$ are the actual partial syndrome $S_1$. A timing diagram for computing $S_1$ syndromes is shown in FIG. 21.

Mathematically, the computation of partial syndrome $S_1$ for the P codewords can be expressed as follows:

$$S_1=(d_{n-1}\otimes\alpha^{n-1})\oplus(d_{n-2}\otimes\alpha^{n-2})\oplus \dots \oplus(d_1\otimes(d_0\otimes\alpha^0)$$

where $d_m$ values are data bytes associated with a P codeword, and n represents the length of the P codeword, which, in the described embodiment, is 26. It should be appreciated that the mathematical expression for partial syndrome $S_1$ for the P codewords is implemented by the use of Horner's rule which is embodied in circuit 402. Horner's rule is generally well-known to those skilled in the art.

As previously mentioned Q_BUF 414 is 26 locations long. In the described embodiment, as circuit 402 is used for a single error correcting code, each location in Q_BUF 414 is arranged to store partial syndrome $S_0$ and partial syndrome $S_1$. Partial syndrome $S_0$ for a Q codeword can be calculated by adding, through the use of an exclusive OR 440, all data bytes that are relevant to the Q codeword. Specifically, as each data byte sequentially passes through multiplexer 424, the contents of Q_BUF 414 are accessed to locate the intermediate value which is relevant to a particular data byte. The data byte is then added to the relevant intermediate value. Then, the updated intermediate value is rewritten back into Q_BUF 414 at the same location from which the original intermediate value was obtained.

To compute partial syndrome $S_1$ for a Q codeword, it should be appreciated that from the point-of-view of the elements that make up the codeword, the data bytes do not arrive sequentially. By way of example, with reference to the data matrix of FIG. 5, when data byte "0" arrives, data byte "0" is the first element of Q codeword number zero, i.e., $Q^0$. However, when data byte "1" arrives, data byte "1" is the second element of $Q^{25}$, and when data byte "2" arrives, data byte "2" is the third element of $Q^{24}$. Therefore, a recursive calculation for partial syndrome $S_1$ of the Q codewords, which is similar to the recursive calculation for syndromes $S_1$ of P codewords is not used since there are no previous intermediate values. That is, when data byte "2" arrives, corresponding to the third element of $Q^{24}$, there are no previous intermediate values corresponding to the first and second elements of $Q^{24}$ since the data bytes corresponding to these elements are data bytes 1032 and 1076, respectively. Under this condition, recursion generally cannot be used.

The computation of $S_1$ syndromes for Q codewords can generally be expressed as follows:

$$S_1=(d_{44}\otimes\alpha^{44})\oplus(d_{43}\otimes\alpha^{43})\oplus \dots \oplus(d_1\otimes\alpha^1)\otimes(d_0\otimes\alpha^0)$$

where $d_m$ are the data bytes associated with a Q codeword which contains 45 elements. To compute the partial syndrome $S_1$ for a Q codeword, each element of the Q codeword is essentially multiplied by a power of α. It should be appreciated that the general format of expressions used in the calculation of partial syndrome $S_1$ for Q codewords and partial syndrome $S_1$ for P codewords are substantially the same, with the main difference being a function of the lengths of the codewords.

The computation of partial syndrome $S_1$ for Q codewords is accomplished using an alpha down counter 452 which provides an output that is applied to data bytes passed from multiplexer 424 using a multiplier 454. Alpha decrementing counter 452 in arranged to be loaded with an appropriate power of α and thence downcounted for use in computing partial syndrome $S_1$ for the Q codewords. The data bytes then pass through adder 456 where the data bytes are added, using an exclusive OR 456, to any associated intermediate results obtained from Q_BUF 414 in order to update the associated intermediate results. Once the intermediate results are updated, the updated intermediate results are written back into Q_BUF 414 into the same locations from which the intermediate results were obtained. It should be appreciated that once the last data byte has been added to the intermediate results, the contents of Q_BUF 414 are then considered to be partial syndrome $S_1$ for the Q codewords.

Once the partial syndromes are calculated, the partial syndromes can be clocked out of P_BUF 412 and Q_BUF 414, through multiplexers 458 and 460, respectively, to registers 470 and 472. Specifically, partial syndrome So associated with the P codewords are clocked out of P_BUF 412 on line 462, which is an input to multiplexer 458. Multiplexer 458 provides inputs to register 470. Similarly, partial syndrome $S_0$ associated with the Q codewords are clocked out of Q_BUF 414 on line 466 which is also an input to multiplexer 470. Partial syndrome $S_1$ associated with the P codewords are clocked out of P_BUF 412 on line 464, which is an input to multiplexer 460. As shown, multiplexer 460 provides inputs to a register 472. Partial syndrome $S_1$ associated with the Q codewords are clocked out of Q_BUF 414 on line 468, which is also an input to multiplexer 460. Therefore, the partial syndromes can be accessed through registers 470 and 472.

Figure 14:
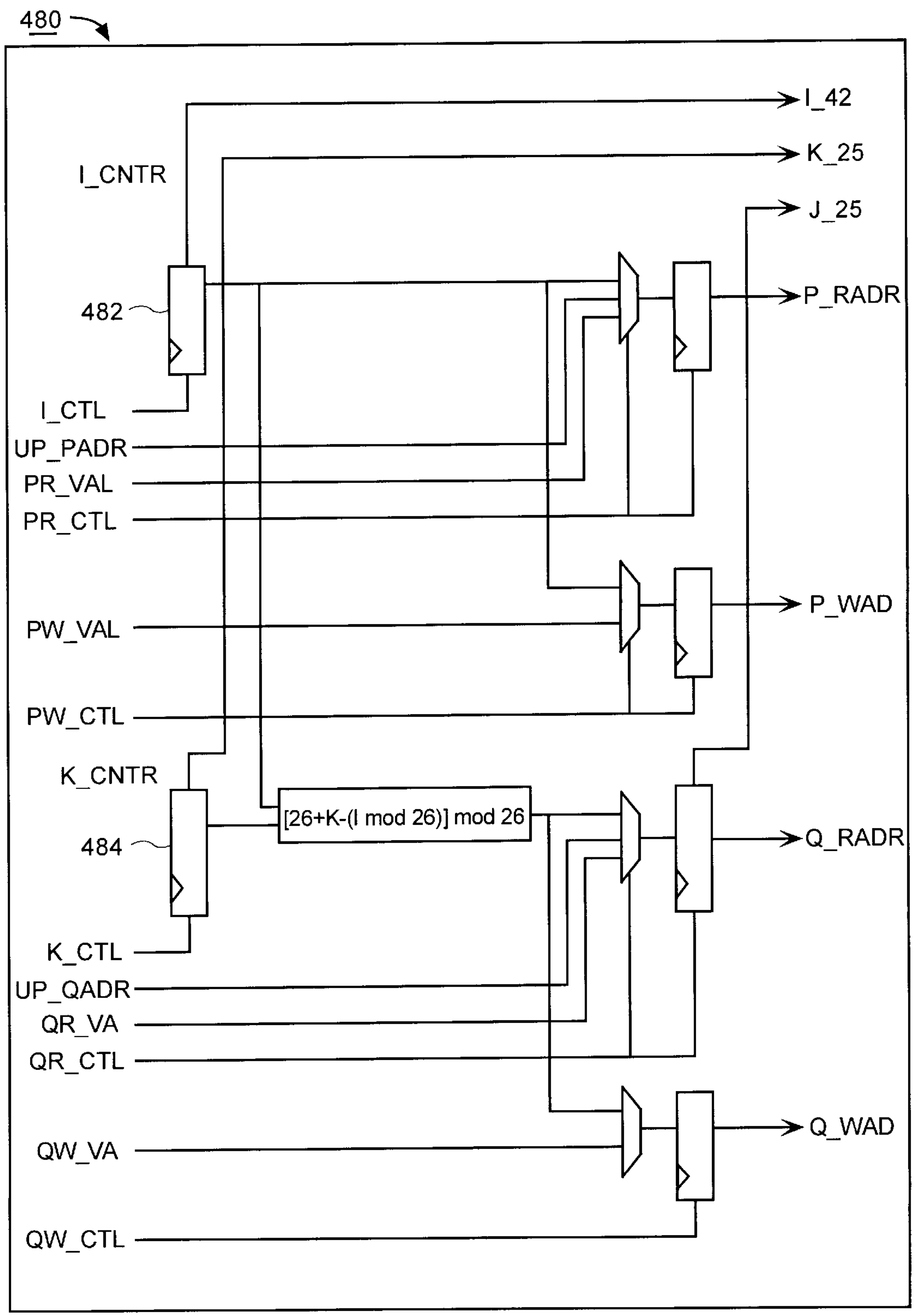
FIG. 14 is a circuit diagram of one circuit which is suitable for use to address local buffers holding partial syndromes in accordance with an embodiment of the present invention.

FIG. 14 is a block diagram representing syndrome address logic in accordance with an embodiment of the present invention. A circuit 480 includes a binary counter I_CNTR 482 associated with columns of a data matrix, as for example the data matrix described above with respect to FIG. 5, and a binary counter K_CNTR 484 associated with the rows of a data matrix. As each data byte arrives sequentially from a DRAM, an appropriate address to a P_BUF and a Q_BUF is generated. With reference to FIG. 13, P_RADR is used to address the read port of P_BUF 412 while P_WADR is used to address the write port of P_BUF 412. Similarly, Q_RADR is used to address the read port of Q_BUF 414, while Q_WADR is used to address the write port of Q_BUF 414.

I_CNTR 482 is a modulo 42 binary counter which increments as each byte arrives. K_CNTR 484 is a binary counter which increments when I_CNTR 482 has reached the count of 42, signaling the beginning of the next row in a data matrix. In general, I represents the contents of I_CNTR 482 and K represent the contents of K_CNTR 484. Q_RADR can then generated as follows:

$$Q\_RADR=[26+K-(I \text{ modulo } 26)] \text{modulo } 26$$

Figure 15:
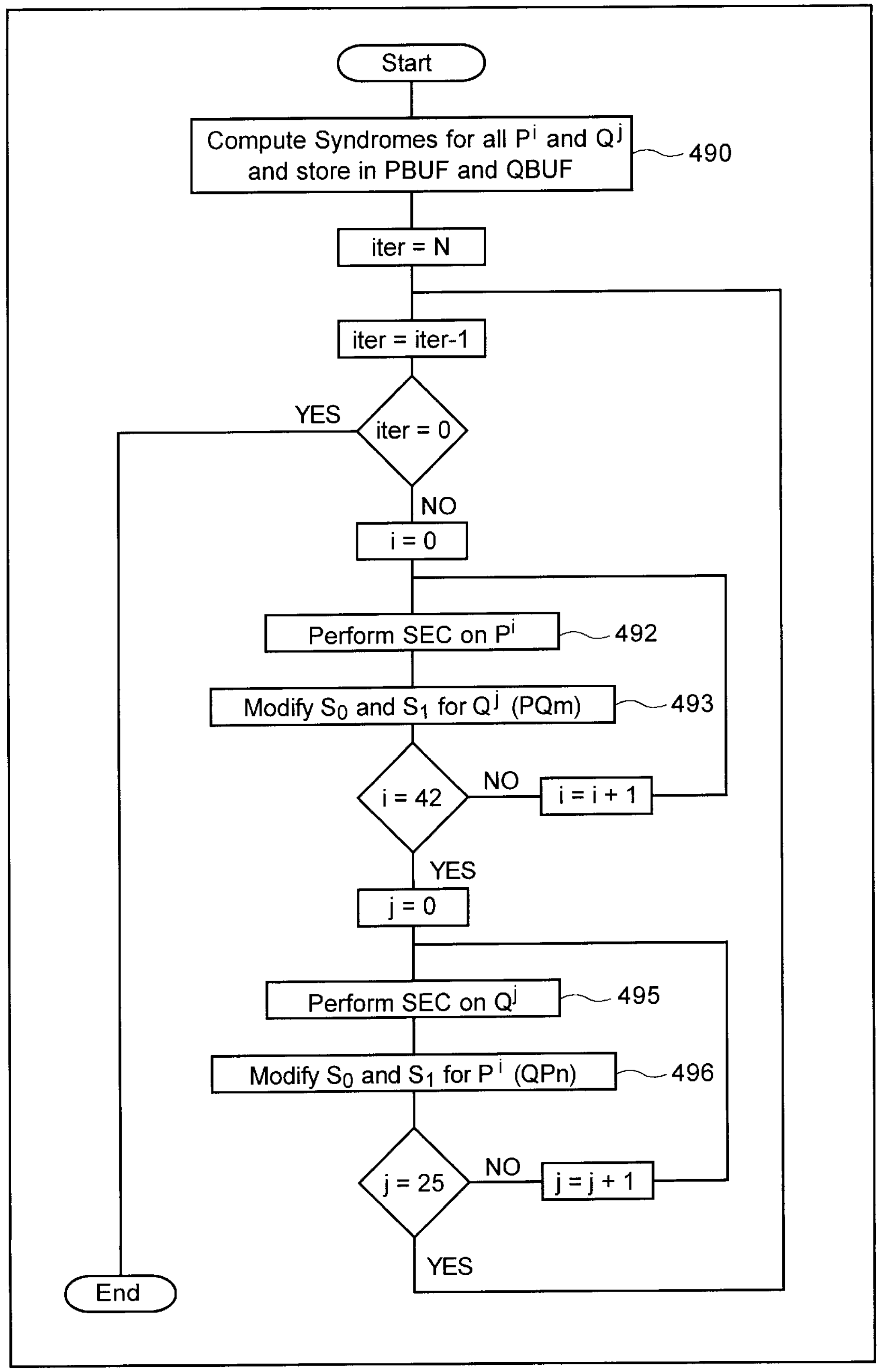
FIG. 15 is a process flow diagram which illustrates the steps associated with calculating partial syndromes in accordance with an embodiment of the present invention.

FIG. 15 is a process flow diagram which outlines an enhanced EDAC process, i.e., an ECC process, in accordance with an embodiment of the present invention, as will be described in more detail below. The present invention allows the computation of the P and Q partial syndromes to occur substantially on-the-fly as data arrives sequentially. As such, there is dedicated circuitry for computing the partial syndromes, as described above with respect to FIG. 13, which relies upon storing intermediate results in the P and Q Buffers as each data byte is processed.

As will be appreciated by those skilled in the art, the data organization for either the low-order or high-order data bytes in a data matrix is such that the entry in each cell is the DRAM word address of where a particular data byte is located. As each data byte arrives sequentially from the DRAM, a determination must be made as to which P codeword and which Q codeword the data byte "belongs" to in order to access the corresponding entry in the P_BUF and the Q_BUF.

FIG. 16 is a data matrix which shows the identification of P codewords contained therein in accordance with an embodiment of the present invention. Within a data matrix 520, entries in each cell 524 correspond to the P_BUF address which is accessed in the course of computing the P partial syndromes. In other words, as data bytes arrive from DRAM, an identification can be made of which P codeword the data byte is an element of. FIG. 17 is a data matrix which shows the identification of Q codewords contained therein in accordance with an embodiment of the present invention. Entries in each cell 530 of a data matrix 528 correspond to the Q_BUF address which is accessed when the Q partial syndromes are computed. In other words, as each sequentially-arriving data bytes arrive from DRAM, an identification is made of which Q codeword the data byte is an element of. Each sequentially-arriving data byte requires an access to specified addresses of P_BUF and Q_BUF.

As previously mentioned, in one embodiment, a P_BUF is 43 locations long. Each location is arranged to hold the two partial syndromes for each $P^i$ codeword. FIG. 18 is a diagrammatic representation of the contents of a P_BUF in accordance with one embodiment of the present invention. A P_BUF 536 has 43 address locations 538 each of which holds the partial syndromes for a P codeword. By way of example, a first address location **538*a* is arranged to hold $S_0$ and $S_1$ for codeword $P^0$, while a forty-third address location 538*f*** is arranged to hold $S_0$ and $S_1$ for codeword $P^{42}$.

In general, the computation of $S_0$ is simply the modulo-2 addition of substantially all of the data bytes which make up the codeword, including the parity bytes associated with the codeword. Consequently, there is no particular ordering of the data bytes. The steps associated with the computation of $S_0$ for a P codeword assumes that P_BUF is initialized with zeroes. The partial syndromes for all $P^i$ and $q^j$ are computed and stored in P_BUF and Q_BUF. As each data byte arrives the contents of P_BUF are accessed at a given location, as shown in FIG. 16, added to the arriving data byte, and then rewritten back into P_BUF at the same location. That is, the previously stored intermediate results for $S_0$ are obtained from a given location, added to the newly arrived data byte, and then written back into the same location for each newly arrived data byte. In order to perform such operation at full speed, the P_BUF is a dual-ported memory, with the write port of the P_BUF configured as a synchronous port.

FIG. 19 shows the overall timing for obtaining intermediate results for $S_0$ from a given location, adding the results to a new data byte, and then writing the modified results into the same location in accordance with an embodiment of the present invention. That is, FIG. 19 illustrates the overall timing associated with computing partial syndrome $S_0$. As shown, the first 43 bytes, corresponding to the first element of each of the 43 P codewords, are written into a P_BUF. After the first 43 data bytes are obtained, the partial syndrome calculations are performed by first reading the previously calculated intermediate from the location in the P_BUF, adding the intermediate results from the P_BUF to the incoming data byte, and then writing back the result into the original location within P_BUF. It should be appreciated that the specific location accessed within P_BUF is determined by which P codeword the incoming data byte is an element of, as shown in FIG. 16. As shown in FIG. 19, the data is obtained from DRAM, the intermediate value is read from the P_BUF, and the intermediate value is updated during approximately one clock cycle. The updated intermediate value is then stored into the associated location, or the location from which the original intermediate value was obtained in the P_BUF during the next clock cycle, while the next intermediate value is obtained and processed as before. This process is repeated until all data values have be obtained from DRAM and processed.

Figure 20:
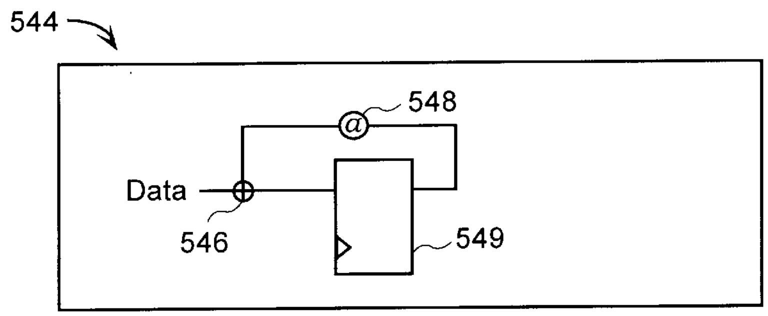
FIG. 20 is a block diagram of one circuit which is suitable for use in recursively calculating $S_1$ partial syndromes in accordance with an embodiment of the present invention.

Mathematically, the computation for $S_1$ can be expressed as follows:

$$S_1=(d_{n-1}\otimes\alpha^{n-1})\oplus(d_{n-2}\otimes\alpha^{n-2})\oplus \ldots \oplus(d_1\otimes\alpha^1)\otimes(d_0\otimes\alpha^0)$$

where $d_k$ are the data from the DRAM which arrives sequentially. FIG. 20 is a diagram of a circuit which is suitable for computing $S_1$ recursively in accordance with an embodiment of the present invention. A circuit 544 is arranged such that coefficients of a received polynomial r(x)

are passed through adder 546, which functions as modulo-2 adder using an exclusive OR circuit. The output from adder 546 is multiplied by α548 in order to obtain an intermediate value as part of the overall calculation of partial syndrome $S_1$. Once obtained, the value is clocked into a register, or flip-flop 549. Using circuit 544, data bytes arriving sequentially are added to previously calculated intermediate results multiplied by α. It should be appreciated that the ordering of the bytes is important as is required for Horner's rule, which is embodied by circuit 544.

In one embodiment, the method of calculating $S_1$ involves substituting P_BUF for flip-flop 549 in circuit 544. When flip-flop 549 is replaced with P_BUF, as each data byte arrives the appropriate contents of P_BUF, as shown in FIG. 16, are read, multiplied by α, added to the incoming data byte, and then rewritten back into P_BUF.

FIG. 21 is a timing diagram associated with calculating partial syndrome $S_1$ in conjunction with P_BUF. As shown, the first 43 bytes from the DRAM are written into the P_BUF. After the first 43 data bytes are obtained, partial syndrome $S_1$ is calculated by reading the intermediate value from an appropriate location in the P_BUF, performing arithmetic operations on the intermediate value obtained from the P_BUF to the incoming data byte obtained from DRAM, and then rewriting the result back into P_BUF. It should be appreciated that the specific location accessed within P_BUF is determined by which P codeword the incoming data byte is an element of, as shown in FIG. 16. It should be appreciated that this generally operation takes one clock cycle and, hence, the $S_1$ partial syndrome calculations and $S_0$ partial syndrome calculations can occur substantially simultaneously.

As previously mentioned, a Q_BUF is 26 locations long, with each location holding the two partial syndromes associated with each $Q^i$. FIG. 22 is a representation of Q_BUF in accordance with an embodiment of the present invention. A Q_BUF 552 includes 26 address locations 554. Each address location 554 contains $S_0$ and $S_1$ for a given $Q^i$. For example, a first address location **554*a* contains $S_0$ and $S_1$ for $Q^0$, while a twenty-sixth address location 554*f*** contains $S_0$ and $S_1$ for $Q^{25}$.

In general, the computation of $S_0$ for Q codewords is substantially identical to the computation of $S_0$ for the P codewords. In other words, the computation of $S_0$ for a particular Q codeword is the modulo-2 addition of all data bytes, including parity bytes, which make up the Q codeword. As such, the data bytes do not need to be in any particular order.

The steps involved in the computation of $S_0$ for the Q codewords assumes that Q_BUF is initialized with zeroes. As each data bytes arrive sequentially, the appropriate contents of Q_BUF are read from a given location, as defined by FIG. 17, added to the incoming data byte, and then rewritten into the same location in Q_BUF. In order to perform this operation at full speed, the Q_BUF, like the P_BUF, is a dual-ported memory, with the write port configured as a synchronous port.

Typically, the computation of $S_1$ for Q codewords differs substantially from the computation of $S_1$ for P codewords. Computing $S_1$ for P codewords recursively was possible because the sequentially-arriving data bytes from DRAM were in the right order so far as the elements making up the P codewords. That is, each element making up a P codeword arrives sequentially, in the desired order, thereby enabling the recursive circuit shown in FIG. 20 to be used. That is possible because the first sequentially-arriving 43 bytes correspond to the first elements of each of the P codewords, the next sequentially-arriving 43 bytes correspond to the second elements of each of the P codewords, and so forth. In this way, the intermediate results stored in P_BUF are correct in that they allow a recursive calculation of $S_1$ such that the ordering of the elements of the codewords is preserved.

In the computation of $S_1$ for Q codewords, however, the data bytes do not arrive sequentially from the point of view of the elements that make up each of the Q codewords. For example, when data byte "1" arrives, it is the second element of $Q^{25}$. That is, the first element of codeword $Q^{25}$ had not previously arrived such that the recursive calculation method can be used. Consequently, the recursive circuit of FIG. 20 cannot be used in the computation of $S_1$ for the Q codewords since the recursion requires the sequential ordering of the elements making up the codeword. Instead, the fundamental definition of $S_1$ can be used as a means of finding a way to calculate $S_1$ for the Q codewords, thereby allowing the computation of the partial syndromes to occur using a single, sequential pass through DRAM.

$S_1$ as previously mentioned, can be defined as follows:

$$S_1=(d_{n-1}\otimes\alpha^{n-1})\oplus(d_{n-2}\otimes\alpha^{n-2})\oplus\ldots\oplus(d_1\otimes\alpha^1)\otimes(d_0\otimes\alpha^0)$$

As such, by multiplying each element of a Q codeword by the appropriate power of α, $S_1$ can computed. Since each Q codeword contains 45 elements, with reference to the columns of the data matrix shown in FIG. 5, the first element of each Q codeword resides in column 0, the second element of each Q codeword resides in column 1, and so forth up to element 43 in column 42. Elements 44 and 45 of the Q codewords differ, however, in that they are in rows 26 and 27, as shown in FIG. 17.

To compute $S_1$, the elements corresponding to column 0 of a data matrix, FIG. 5, are multiplied by $\alpha^{44}$, elements in column 1 are multiplied by $\alpha^{43}$, and so forth up to column 42, whose elements are multiplied by $\alpha^2$. The Q parity bytes, in rows 26 and 27 of the data matrix, are multiplied by $\alpha^1$ and $\alpha^0$, respectively. FIG. 23 is a circuit which is suitable for computing $S_1$ for the Q codewords in accordance with an embodiment of the present invention. A circuit 560 includes a decrementing counter, i.e., alpha down counter 562, which counts down in powers of α. Data bytes passed into circuit 560 are multiplied by a power of α, then added to an appropriate intermediate value of $S_1$ obtained from Q_BUF 564.

With respect to FIG. 13 and FIG. 14, alpha down counter 452 is initially loaded with $\alpha^{44}$, while I_CNTR 482 is initialized with 0. As each data byte arrives, corresponding to the first row of matrix 228, FIG. 5, alpha down counter 452 is decremented, while I_CNTR 482 is incremented. Then, when data byte "1" arrives, the second data byte, alpha down counter 452 contains the value $\alpha^{43}$ while I_CNTR 482 is 1. When data byte "2", the third data arrives, alpha down counter 452 contains the value $\alpha^{42}$ and I_CNTR 482 contains 2. When data byte "42" arrives, the last data byte of row 0, alpha down counter 452, contains the value $\alpha^2$, and I_CNTR 482 contains the value 42. At this point, K_CNTR 484 is incremented in preparation for data byte 43, the first byte of the second row, row 1. In addition, I_CNTR 482, is reinitialized with zero, corresponding to the first column, while alpha down counter 452 is reinitialized with the value $\alpha^{44}$, the value corresponding to column 0.

FIG. 15 is a process flow diagram which outlines an enhanced EDAC process, i.e., an ECC process, in accordance with an embodiment of the present invention. By storing the partial syndromes in P_BUF and Q_BUF, in step 490, correction operations can be performed without accessing DRAM until the corrected data values are to be written into DRAM.

Prior to attempting a single error correction, $S_0$ and $S_1$ are inspected to determine what actions can be taken, as summarized in FIG. 24. As shown in FIG. 24, when $S_0$ and $S_1$ have zero values, no errors are present in an associated codeword. Therefore, no corrective action is necessary. Alternatively, when one of $S_0$ and $S_1$ has a zero value while the other has a non-zero value, in one embodiment, single error correction is not considered to be possible. However, when both $S_0$ and $S_1$ have non-zero values, then single error correction is considered to be possible.

If there is a single error in a P codeword, a SEC operation, step 492, can be performed. The location of the error may be obtained from partial syndromes $S_0(P^i)$ and $S_1(P^i)$ as follows:

$$k=\log_{\alpha}(S_1(P^i)/S_0(P^i))=[\log_{\alpha}S_1(P^i)-\log_{\alpha}S_0(P^i)+255]\text{modulo } 255$$

where $S_0(P^i)$ contains the error pattern, and k is the subscript of $P_k$, the location of an error in codeword $P^i$.

A single error-correcting Reed-Solomon code is guaranteed to correct one random error in a codeword. If there are two or more errors in a codeword, either a miscorrection occurs or an uncorrectable event results. By definition, a miscorrection cannot be detected. However, an uncorrectable event can be detected by performing a range check on the computed value of location k. In general, for each $P^i$, k is in the range of $0 \leqq k \leqq 25$. In the event that k lies outside of this range, the determination is that an uncorrectable event has taken place.

Once k is determined, the corresponding data byte from DRAM is accessed, modified, and then re-written with the correct value. Given values for k and i, the corresponding address in memory can be computed as follows:

$$\text{DRAM address}=(43*k+i) \text{ modulo } 1118$$

When the errored byte, d, is obtained, the corrected data byte d' is obtained as follows:

$$d'=d \oplus S_0(P^i)$$

After d' is computed, d' is re-written into the same address location that d was obtained from.

Each data byte is simultaneously encoded in a P codeword and a Q codeword. Therefore, if a single-error correction (SEC) is performed on a P codeword, then the partial syndromes of the intersecting Q codeword, $PQ_m$ must be modified as well, step 493, since the affect of the error in the P codeword is also contained in the partial syndrome of the intersecting Q codeword.

To modify the $PQ_m$ partial syndromes, which are the m-th elements within Q codewords that intersect with a specific elements within P codewords, a determination is made regarding which $Q^j$ and which $Q_l$ are affected by $P_k$. In order to determine l, the following relationship can be used:

$$l=i$$

$Q^j$, in turn, can be determined using the following relationship:

$$k'=25-k$$

$$j=[26+(k'-(1 \text{ modulo } 26))]\text{modulo } 26$$

where i is the superscript of $P^i$, j is the superscript of $Q^j$, k' is the subscript of $P_k$, and 1 is the subscript of $Q_l$.

Once j is calculated, the partial syndromes for $Q^j$ can be obtained, and the update calculations proceed as follows:

$$S_0(Q^j)'=S_0(P^i)\oplus S_0(Q^j)$$

$$S_1(Q^j)'=(S_0(P^i)\otimes\alpha^{(44-1)})\oplus S_1(Q^j)$$

where $S_0(Q^j)'$ and $S_1(Q^j)'$ are the updated partial syndromes, $S_0(Q^j)$ and $S_1(Q^j)$ are the original partial syndromes stored in Q_BUF, $S_0(P^i)$ and $S_1(P^i)$ are the $P^i$ partial syndromes, and 1 is the subscript of $Q_1$. The effect of the update calculations, therefore, is to "back out" the contribution of the error from the partial syndromes for the intersecting Q codeword. It should be appreciated that the exponent of $\alpha$ is referenced to the end of $Q^j$, while $Q_1$ is referenced from the beginning of $Q^j$. As shown in FIG. 15, steps 492 and 493, as described above, are repeated for each $P^i$. After all P codewords have been processed, the Q codewords are next processed.

If there is a single error in a Q codeword, step 495, the location of the error may be obtained from the partial syndromes $S_0(Q^j)$ and $S_1(Q^j)$ as follows:

$$1=\log\alpha(S_1(Q^j)/S_0(Q^j))=[\log\alpha S_1(Q^j)-\log_{\alpha}S_0(Q^j)+255]\text{modulo } 255$$

where $S_0(Q^j)$ contains the error pattern, and 1 is the subscript of $Q_1$. A range check is performed to ensure that 1 is in the range of $2 \leqq 1 \leqq 44$. In the event that 1 lies outside of the specified range, the indication is that an uncorrectable event has taken place. Once 1 is determined, the corresponding data byte from DRAM is accessed, modified, and then re-written back into DRAM with the correct value.

After 1 and have been determined, the corresponding address in memory, ie., DRAM address, is computed as follows:

$$\text{DRAM address}=(44*1+43*k) \text{ modulo } 1118$$

with:

$$k=(j+1) \text{ modulo } 26$$

where j is the superscript of $Q^j$ and 1 is the subscript of $Q_1$.

When the errored byte, d, is obtained from memory, the corrected value d' is given by:

$$d'=d\oplus S_0(Q^j)$$

After d' is calculated, d' is re-written into the same address in memory from which d was obtained.

If a SEC is performed on a Q codeword, then the partial syndromes of the intersecting P codeword, $QP_n$, are also modified in step 496, due to the fact that the affect of the error in the Q codeword is also contained in the partial syndrome of the intersecting P codeword. To modify the $QP_n$ partial syndromes, it is necessary to determine which $P^i$ and $P_k$ are affected by $Q_1$.

$P^i$ can be determined using the following relationship:

$$l'=44-1$$

$$i=l'$$

where i is the superscript of $P^i$ and l' is the subscript of $Q_1$. k can be determined as follows:

$$k=(j+1) \text{ modulo } 26$$

where 1 is the subscript of $Q_1$ and i is the superscript of $P^i$. Once i is calculated, and the partial syndromes for $P^i$ are obtained, the partial syndromes can be updated as follows:

$$S_0(P^i)=S_0(Q^j)\oplus S_0(P^i)$$
$$S_1(P^i)'=S_0(Q^j)\otimes\alpha^{(25-k)}\oplus S_1(P^i)$$

where $S_0(P^i)'$ and $S_1(P^i)'$ are the updated partial syndromes, $S_0(P^i)$ and $S_1(P^i)$ are the original partial syndromes stored in P_BUF, $S_0(Q^j)$ and $S_1(Q^j)$ are the $Q^j$ partial syndromes, and k is the subscript of $P_k$. In general, the effect of the updating calculations, therefore, is to "back out" the contribution of the error from the partial syndromes for the intersecting P codeword. The exponent of a is typically referenced to the end of $P^i$, while $P_k$ is typically referenced from the beginning of $P^i$. As shown in FIG. 15, steps 495 and 496 are repeated for each $Q^j$. After all Q codewords have been processed, the correction operations are repeated in accordance with a setting for N.

An enhanced mechanism for generating parity bytes can be accomplished through the use of one sequential pass through memory by using the existing partial syndrome computation circuitry, as described above with respect to FIGS. 13 and 14. As described above, a single error-correcting Reed-Solomon code can be used either to correct a single random error, or to correct two erasures. FIG. 25 is a representation of a codeword in which parity bytes have been erased in accordance with an embodiment of the present invention.

Computing the partial syndromes for a codeword 570 in which parity byte positions 572, 574 have been obliterated can be accomplished using a single error-correcting Reed-Solomon code. Since the locations of errors are known, the correct parity bytes can be "filled in" through the use of erasure decoding. In essence, to generate parity bytes, partial syndromes are computed for the data for which parity bytes are to be generated in substantially the same manner as used for generating codewords for CD-ROMs. However, correction operations are now applied in order to generate the correct parity bytes.

Such a method for correcting parity bytes can be accomplished using one sequential pass through memory, thus preserving memory bandwidth. In addition, by enabling substantially the same partial syndrome circuitry to be used for both correction operations as well as for generating parity bytes, the amount of circuitry associated with the two processes can be reduced.

When there are exactly two errors in a codeword, the partial syndromes for the codewords can be represented as follows:

$$S_0=v1\oplus v2$$
$$S_1=(v1\otimes\alpha^{loc1})\oplus(v2\otimes\alpha^{loc2})$$

where v1 is the error pattern at a first error location, ie., loc1, and v2 is the error pattern at a second error location, i.e., loc2. When both error locations are known, $\alpha^{loc1}$ and $\alpha^{loc2}$ are fixed numbers. When $\alpha^{loc1}$ and $\alpha^{loc2}$ are fixed numbers, v1 and v2 can be determined by an elimination of variables. As such, v1 and v2 can be obtained as follows:

$$v1=(S_1\oplus(S_0\otimes\alpha^{loc2}))/(\alpha^{loc1}\oplus\alpha^{loc2})$$
$$V2=(S_1\oplus(S_0\otimes\alpha^{loc1}))/(\alpha^{loc1}\oplus\alpha^{loc2})$$

In the case of "erased" parity byte locations, the following relationships are defined:

loc1=0 loc2=1

In other words, the parity bytes are always located at the last two positions of the codeword, which corresponds to $\alpha^0$ and $\alpha^1$. As such, corresponding parity bytes PB0 and PB1 can be expressed as:

$$PB0=v1=(S_1\oplus(S_0\otimes\alpha^1))/(\alpha^0\oplus\alpha^1)$$
$$PB1=v2=(S_1\oplus(S_0\otimes\alpha^0))/(\alpha^0\oplus\alpha^1)$$

In other words, the "error patterns" are precisely the parity bytes that are sought. Since $\alpha^0\otimes\alpha^1=\alpha^{25}$ in $GF(2^8)$, the expressions for PB0 and PB1 can be rewritten as:

$$PB0=(S_1\oplus(S_0\otimes\alpha^1))/\alpha^{25}$$
$$PB1=(S_1\oplus(S_0\otimes\alpha^{0))/\alpha 25}$$

In general, the parity bytes for each of the P and Q codewords are generated by computing the P and Q partial syndromes for the data field, FIG. 5, in the same manner as is done for an error correction operation described with respect to FIG. 15. The essential difference between the computations is that for computing parity bytes, in one embodiment, processing stops upon the arrival of word 1031 from the DRAM memory. Erasure decoding is then performed on each of the partial syndromes in P_BUF. After erasure decoding takes place, each entry in P_BUF contains the computed parity bytes for each of the P codewords.

The Q partial syndromes are next updated with the newly computed P parity bytes since the Q codewords include the parity bytes of the P codewords. The processing of parity bytes is completed with the performance of erasure decoding on the partial syndromes in Q_BUF, such that each of the partial syndromes is replaced with the newly computed parity bytes. Once both P_BUF and Q_BUF are updated, in one embodiment, the contents of P_BUF and Q_BUF are written into DRAM. It should be appreciated that erasure decoding is typically first performed on $p^i$ rather than on $Q^j$ due to the fact that $Q^j$ encodes the parity bytes of $P^i$.

When the partial syndromes for a data field are computed, substantially all the information necessary for computing the P parity bytes is available. However, after the partial syndromes are computed, sufficient information does not exist for computing the Q parity bytes. The lack of sufficient information for computing the Q parity bytes stems from the fact that Q codewords include the P parity bytes. At the conclusion of the partial syndrome computation for the data field, though, parity bytes for the P codewords have not yet been computed. Therefore, the partial syndromes for the Q codewords are still not completed. As such, it is first necessary to compute the P parity bytes before continuing with the computation of Q partial syndromes in order to include the newly computed P parity bytes in the computation of the Q partial syndromes. After the Q partial syndromes are computed, erasure decoding can then be performed on the Q partial syndromes to compute parity bytes for the Q codewords.

FIG. 26 is a representation of the contents of a P_BUF after the partial syndromes are computed, but prior to performing erasure decoding, in accordance with an embodiment of the present invention. P_BUF 580, as previously mentioned, includes address locations 582 which contain partial syndromes $S_1$ and $S_0$. After erasure decoding is performed at each address location 582, the contents of P_BUF 580 are essentially transformed from partial syndromes into parity bytes, as shown in FIG. 27. Such a transformation occurs by performing erasure decoding on the contents associated with each address location 582 after the partial syndromes for the data field are computed.

With reference to FIG. 28, the computation of the Q partial syndromes using the P parity bytes will be described in accordance with an embodiment of the present invention. The P parity bytes are used as input to the Q partial syndrome computation circuit 590 to finish the computations associated with determining the partial syndromes for the Q codewords. The Q partial syndrome computation circuit 590 includes P_BUF 594 and Q_BUF 596 which are part of P_BUF feedback sub-circuit 595 and Q_BUF sub-circuit 597, respectively. P_BUF feedback sub-circuit 596 is arranged to generate P parity bytes which are then provided to Q_BUF sub-circuit 597, which is substantially the same as the Q partial syndrome computation circuit described above with respect to FIG. 23. Q_BUF sub-circuit 597 then computes the Q partial syndromes.

The Q partial syndrome computation circuit 590 basically uses the contents of P_BUF 594, which contain P parity bytes, as data for a correction operation. In other words, for a correction operation, the P parity bytes are processed along with the data field. When the P parity bytes are processed, however, the P parity bytes are extracted from P_BUF 594, rather than from DRAM memory, from which the data field is extracted.

It should be appreciated that, according to the described embodiment, when correction processing reaches the P parity bytes in row 24 of a data matrix, e.g., row **230*i* data matrix 228 of FIG. 5, the contents of each low-order byte of P_BUF, which contains parity bytes PB0, is routed through a multiplexer in an overall partial syndrome computation circuit, e.g., multiplexer 424 of FIG. 13. The contents of each low-order byte is routed through a multiplexer since the bytes are the "data" needed to compute the Q codeword partial syndromes. Similarly, when correction processing reaches the parity bytes in row 25 of a data matrix, e.g., row 230*j* in data matrix 228 of FIG. 5, the multiplexer 424 of FIG. 13** selects the high-order byte of P_BUF in order to route parity bytes PB 1 through the Q partial syndrome computation circuitry.

Figure 29:
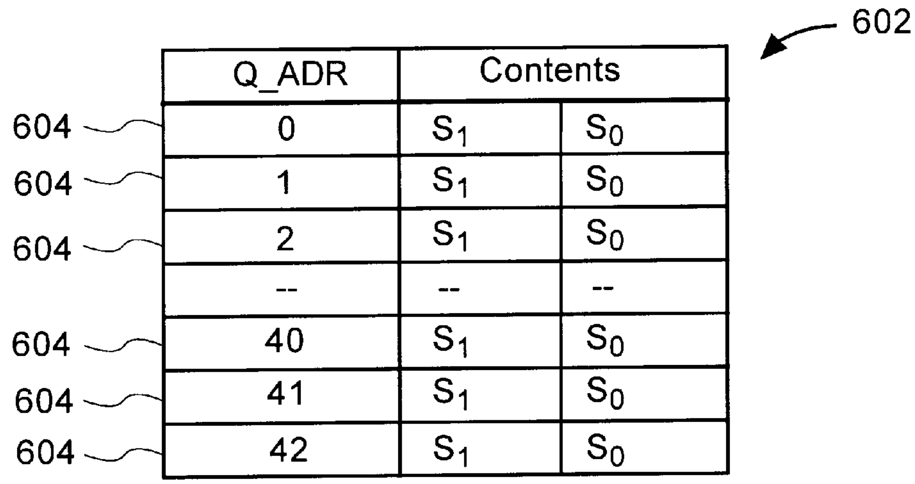
FIG. 29 is a representation of the contents of a Q buffer after partial syndromes have been computed in accordance with an embodiment of the present invention.
Figure 30:
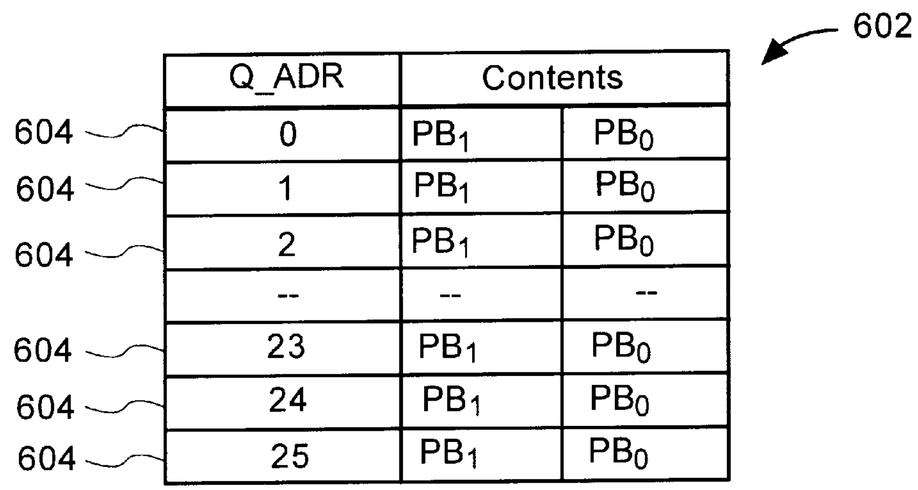
FIG. 30 is a representation of the contents of a Q buffer after erasure decoding has been performed in accordance with an embodiment of the present invention.

Referring back to FIG. 28, after the P parity bytes are routed through Q_BUF subcircuit 597, Q_BUF 596 contains the syndromes for both the data field and the P parity bytes. Then, erasure decoding is performed using the Q partial syndromes to generate the parity bytes for the Q codewords, as shown in FIGS. 29 and 30. FIG. 29 is a representation of Q_BUF prior to the generation of the Q parity bytes in accordance with an embodiment of the present invention. Q_BUF 602 includes partial syndromes $S_1$ and $S_0$ at each address location 604. After erasure decoding is performed at each address location 604, the contents of Q_BUF 602 are essentially transformed from partial syndromes into parity bytes, as shown in FIG. 30. Such a transformation occurs by performing erasure decoding on the contents of each address location 604 after the Q partial syndromes for the data field are computed.

After the P parity bytes and Q parity bytes are generated, the parity bytes can be written to DRAM. In one embodiment, writing parity bytes into DRAM can be accomplished by reading out the contents of P_BUF and reading out the contents of Q_BUF. Once the parity bytes are written into DRAM, the generation of the parity bytes is considered to be completed.

Although only a few embodiments of the present invention have been described, it should be understood that the present invention may be embodied in many other specific forms without departing from the spirit or the scope of the present invention. By way of example, the number of redundancy bits, or parity bits, can be widely varied depending upon the number of errors which are to be corrected in a codeword. As a result, the length of codewords, both P codewords and Q codewords, can also be widely varied. Therefore, the described embodiments should be taken as illustrative and not restrictive, and the invention should be defined by the following claims and their full scope of equivalents.

What is claimed is:

1. A method for processing encoded data using error control coding comprising:

obtaining Q codewords and P codewords from a single pass through a codeword storage location, said P codewords and Q codewords defining a block of data bytes, wherein each of said P codewords includes data bytes defining a column in said block and wherein each of said Q codewords includes data bytes defining a diagonal in said block;

calculating Q partial syndromes for said diagonal Q codewords;

calculating P partial syndromes for said column P codewords; and storing said Q partial syndromes and said P partial syndromes in a buffer separate from said codeword storage location.

2. A method for processing encoded data as recited in claim 1 wherein said buffer includes a first buffer and a second buffer, wherein said P and Q partial syndromes are calculated in parallel, and wherein said operation of storing said Q partial syndromes and said P partial syndromes in said buffer includes:

storing said Q partial syndromes in said first buffer; and storing said P partial syndromes in said second buffer.

3. A method for processing encoded data as recited in claim 2 wherein calculating said P partial syndromes for said P codewords includes recursively calculating each of said P partial syndromes.

4. A method for processing encoded data as recited in claim 3 further including storing a plurality of intermediate values for P partial syndromes in said second buffer, said intermediate values being associated with the calculation of said P partial syndromes.

5. A method for processing encoded data as recited in claim 4 recursively calculating each of said P partial syndromes includes:

reading a selected one of said intermediate values from the second buffer;

processing said selected intermediate value, wherein processing said selected intermediate value includes performing arithmetic operations on said selected intermediate value; and storing said processed, selected intermediate value in said second buffer.

6. A method for processing encoded data as recited in claim 4 wherein each of said P codewords is divided into data bytes, and processing said selected intermediate value includes:

a) obtaining a data byte from a selected one of said P codewords, said selected P codeword being associated with said selected intermediate value;

b) multiplying said selected intermediate value by a multiplier;

c) adding said data byte to said selected intermediate value; and d) repeating steps a) through c) until each data byte for said selected P codeword has been sequentially obtained, wherein when each data byte for said selected P codeword has been sequentially obtained, said selected intermediate value forms a corresponding selected one of said P partial syndromes, said selected P partial syndromes being associated with said selected P codeword.

7. A method for processing encoded data as recited in claim 2 wherein said operation of calculating said Q partial syndromes for said Q codewords comprises:

receiving said data bytes of said Q codewords;

determining which Q codeword each of said data bytes is associated with;

calculating Q partial syndromes for said Q codeword using associated data bytes; and storing said Q partial syndromes in said first buffer.

8. A method for processing encoded data as recited in claim 7 further including:

a) obtaining a data byte from a selected one of said Q codewords;

b) multiplying said data byte by an appropriate multiplier to obtain a multiplied value;

c) adding said multiplied value to a selected one of said intermediate values, said selected intermediate value being associated with said selected Q codeword, wherein adding said multiplied value to said selected intermediate value updates said selected intermediate value; and d) storing said selected intermediate value in said first buffer; and e) repeating steps a) through d) until each data byte for said Q codeword has been obtained, wherein when each data byte for said selected Q codeword has been obtained, said selected intermediate value forms a corresponding selected one of said Q partial syndromes, said selected Q partial syndromes being associated with said selected Q codeword.

9. A method as recited in claim 1 further including:

implementing a first error correction process on said P codewords, when said first error correction process uses said P codewords; and implementing a second error correction process on said Q codewords, when said second error correction process uses said Q codewords.

10. A method as recited in claim 9 further including:

modifying said Q partial syndromes in response to said first error correction process; and modifying said P partial syndromes in response to said second error correction process.

11. A method for processing encoded data using a Reed-Solomon error control coding, the method comprising:

retrieving said encoded data from a memory medium, wherein said encoded data is formatted as codewords, said codewords including at least one Q codeword and at least one P codeword, said P codewords and Q codewords defining a block of data bytes, wherein each of said P codewords includes data bytes defining a column in said block and wherein each of said Q codewords includes data bytes defining a diagonal in said block. wherein all of said codewords are accessed in a single pass through said memory medium;

calculating partial syndromes for said accessed data bytes of said column P codewords and diagonal Q codewords;

storing said partial syndromes for said column P codewords and diagonal Q codewords in buffers; and implementing a first error correction process on said accessed codewords, wherein when said codewords include errors, at least some of the errors are corrected by the first error correction process.

12. A method as recited in claim 11 further including the step of modifying said partial syndromes after said first error correction process is implemented.

13. A method as recited in claim 12 further including the step of implementing a second error correction process after said partial syndromes are modified.

14. A method as recited in claim 11 further including updating said codeword in memory after said first error correction process is implemented.

15. A method as recited in claim 11 further including receiving said encoded data received on said memory medium from a transmission medium, wherein said encoded data is encoded using a Reed-Solomon code.

16. A method for processing encoded data as recited in claim 11 further including storing a plurality of intermediate values for partial syndromes in buffers, wherein said partial syndromes are recursively calculated.

17. A method for processing encoded data as recited in claim 16 recursively calculating each of said partial syndromes includes:

reading a selected one of said intermediate values from a selected one of said buffers;

processing said selected intermediate value, wherein processing said selected intermediate value includes performing arithmetic operations on said selected intermediate value; and storing said processed, selected intermediate value in said selected buffer.

18. A method for processing encoded data as recited in claim 16 wherein each of said codewords is divided into data bytes, and processing said selected intermediate value includes:

a) obtaining a data byte from a selected one of said codewords, said selected codeword being associated with said selected intermediate value;

b) multiplying said selected intermediate value by a multiplier;

c) adding said data byte to said selected intermediate value; and d) repeating steps a) through c) until each data byte for said selected codeword has been sequentially obtained, wherein when each data byte for said selected codeword has been sequentially obtained, said selected intermediate value forms a corresponding selected one of said partial syndromes, said selected partial syndromes being associated with said selected codeword.

19. An apparatus for processing data encoded using error control coding comprising:

a main memory arranged to hold encoded data;

circuitry arranged to access said main memory to retrieve said encoded data, said encoded data being formatted as codewords including P codewords and codewords, said P and Q codewords defining a block of data bytes, wherein each of said P codewords includes data bytes defining a column in said block and wherein each of said Q codewords includes data bytes defining a diagonal in said block, said circuitry further being arranged to process said encoded data, said circuitry including a partial syndrome calculation circuit, said syndrome calculation circuit being arranged to compute partial syndromes for said codewords using a single pass through said main memory, said partial syndrome calculation circuit including a buffer arrangement arranged to store said partial syndromes.

20. An apparatus for processing encoded data according to claim 19 wherein said buffer arrangement includes:

a first buffer arranged to store said partial syndromes computed for said P codewords; and a second buffer arranged to store said partial syndromes computed for said Q codewords.

21. An apparatus for processing encoded data according to claim 20 wherein said partial syndrome calculation circuit is further arranged to compute intermediate results for said partial syndromes computed for said P codewords and to compute intermediate results for said partial syndromes computed for said Q codewords, said partial syndrome calculation circuit being configured to compute said partial syndromes for said P and Q codeswords in parallel, said intermediate results for said partial syndromes computed for said P codewords being stored in said first buffer, and said intermediate results for said partial syndromes computed for said Q codewords being stored in said second buffer.

22. An apparatus for processing encoded data according to claim 21 wherein said syndrome calculation circuit is further arranged to:

read a selected one of said intermediate results for said partial syndromes computed for said P codewords from said first buffer;

process said selected partial result by performing arithmetic operations on said selected partial result; and store said processed, selected partial result in said first buffer.

23. An apparatus for processing encoded data according to claim 22 wherein each of said P codewords is divided into data bytes, said partial syndrome calculation circuit further being arranged to:

a) obtain a data byte from a selected one of said P codewords, said selected codeword being associated with said selected partial result;

b) multiply said selected partial result by a multiplier; and c) add said data byte to said selected partial result.

24. An apparatus for processing encoded data according to claim 21 wherein said partial syndrome calculation circuit is further arranged to:

read a selected one of said intermediate results for said partial syndromes computed for said Q codewords from said second buffer;

process said selected partial result by performing arithmetic operations on said selected partial result; and store said processed, selected partial result in said second buffer.

25. An apparatus for processing encoded data according to claim 24 wherein each of said Q codewords is divided into data bytes, said partial syndrome calculation circuit further being arranged to:

a) obtain a data byte from a selected one of said Q codewords, said selected Q codeword being associated with said selected partial result;

b) multiply said data byte by an appropriate multiplier to obtain a multiplied value;

c) add said multiplied value to said selected partial result to update said selected partial value; and d) restore said selected partial value in said second buffer.

26. An apparatus for processing encoded data according to claim 19 further including an error correction circuit in communication with said circuitry, said error correction circuit being arranged to process said codewords and said partial syndromes.

27. An apparatus for processing encoded data according to claim 26 wherein said error correction circuit is a Reed-Solomon error correction circuit.

* * * * *

UNITED STATES PATENT AND TRADEMARK OFFICE
CERTIFICATE OF CORRECTION

PATENT NO : 6,041,431

DATED : March 21, 2000

INVENTOR(S) : Arthur M. Goldstein

It is certified that error appears in the above-identified patent and that said Letters Patent is hereby corrected as shown below:

Title page, Assignee:

Column 1, after [73], change "Adapter" to --Adaptec--.

Signed and Sealed this

Sixth Day of February, 2001

Attest:

Q. TODD DICKINSON

*Attesting Officer* *Director of Patents and Trademarks*